(12) United States Patent
Kim et al.

(10) Patent No.: US 9,748,438 B2
(45) Date of Patent: Aug. 29, 2017

(54) NANOSTRUCTURE SEMICONDUCTOR LIGHT EMITTING DEVICE

(71) Applicant: Samsung Electronics Co., Ltd., Suwon-si, Gyeonggi-do (KR)

(72) Inventors: Jung Sub Kim, Hwaseong-si (KR); Yeon Woo Seo, Hwaseong-si (KR); Dong Gun Lee, Hwaseong-si (KR); Byung Kyu Chung, Seoul (KR); Dae Myung Chun, Hwaseong-si (KR); Soo Jeong Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/190,406

(22) Filed: Jun. 23, 2016

(65) Prior Publication Data

US 2016/0300978 A1 Oct. 13, 2016

Related U.S. Application Data

(63) Continuation of application No. 14/833,832, filed on Aug. 24, 2015, now Pat. No. 9,406,839.

(30) Foreign Application Priority Data

Aug. 25, 2014 (KR) .................. 10-2014-0110721

(51) Int. Cl.
*H01L 33/00* (2010.01)
*H01L 33/06* (2010.01)
(Continued)

(52) U.S. Cl.
CPC ............ *H01L 33/007* (2013.01); *B82Y 20/00* (2013.01); *H01L 33/06* (2013.01); *H01L 33/08* (2013.01);
(Continued)

(58) Field of Classification Search
CPC ......... H01L 33/32; H01L 33/08; H01L 33/20; H01L 33/0075; H01L 33/04; H01L 33/06
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

KR 100661960 B1 12/2006
KR 20120052651 A 5/2012
(Continued)

*Primary Examiner* — Karen Kusumakar
(74) *Attorney, Agent, or Firm* — Harness, Dickey & Pierce, P.L.C.

(57) ABSTRACT

A nanostructure semiconductor light emitting device includes: a base layer formed of a first-conductivity type nitride semiconductor material; and a plurality of light emitting nanostructures disposed on the base layer to be spaced apart from each other, wherein each of the plurality of light emitting nanostructures includes: a nanocore formed of a first conductivity-type nitride semiconductor material, an active layer disposed on a surface of the nanocore and including a quantum well which is divided into first and second regions having different indium (In) composition ratios in a thickness direction thereof; and a second conductivity-type semiconductor layer disposed on the active layer, and an In composition ratio in the first region is higher than an In composition ratio in the second region.

20 Claims, 27 Drawing Sheets

(51) Int. Cl.
*H01L 33/08* (2010.01)
*H01L 33/24* (2010.01)
*H01L 33/32* (2010.01)
*H01L 33/52* (2010.01)
*B82Y 20/00* (2011.01)

(52) U.S. Cl.
CPC .............. *H01L 33/24* (2013.01); *H01L 33/32* (2013.01); *H01L 33/52* (2013.01); *H01L 2224/48091* (2013.01); *H01L 2224/48247* (2013.01); *H01L 2224/48257* (2013.01); *H01L 2933/005* (2013.01); *H01L 2933/0033* (2013.01); *H01L 2933/0058* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,521,274 B2 | 4/2009 | Hersee et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,947,989 B2 | 5/2011 | Ha et al. | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,138,493 B2 | 3/2012 | Ohlsson et al. | |
| 8,179,938 B2 | 5/2012 | Kim | |
| 8,263,987 B2 | 9/2012 | Choi et al. | |
| 8,318,493 B2 * | 11/2012 | Tao | C12N 15/1051 435/419 |
| 8,324,646 B2 | 12/2012 | Lee et al. | |
| 8,351,478 B2 * | 1/2013 | Raring | B82Y 20/00 372/44.011 |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,664,636 B2 | 3/2014 | Konsek et al. | |
| 8,669,125 B2 | 3/2014 | Lowgren | |
| 8,735,931 B2 | 5/2014 | Han et al. | |
| 8,766,295 B2 | 7/2014 | Kim | |
| 2008/0149946 A1 | 6/2008 | Kim et al. | |
| 2014/0138620 A1 * | 5/2014 | Svensson | H01L 33/007 257/13 |
| 2014/0141555 A1 | 5/2014 | Lowgren | |
| 2016/0013362 A1 | 1/2016 | Heo et al. | |

FOREIGN PATENT DOCUMENTS

| | | |
|---|---|---|
| KR | 20120079310 A | 7/2012 |
| KR | 20120083084 A | 7/2012 |
| KR | 2016-0008028 A | 1/2016 |

* cited by examiner

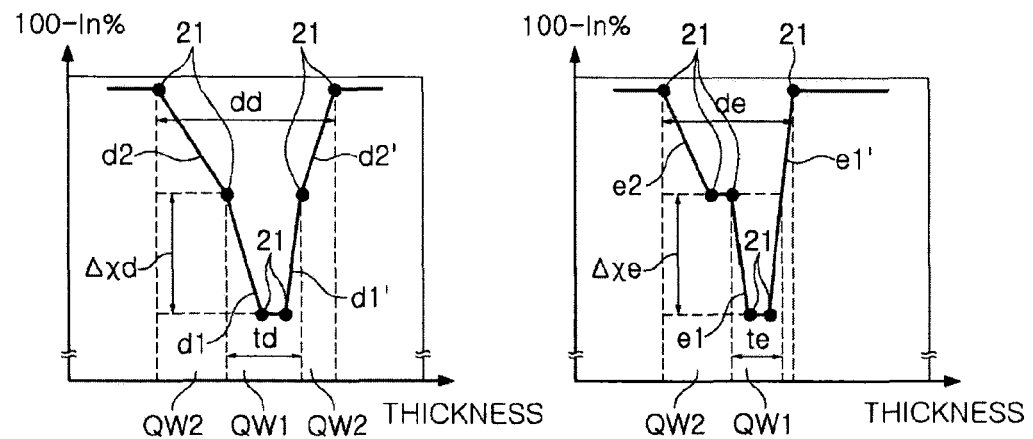
FIG. 18A  FIG. 18B
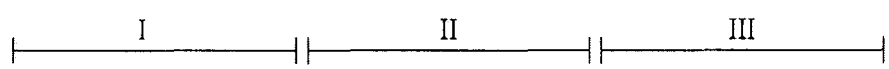
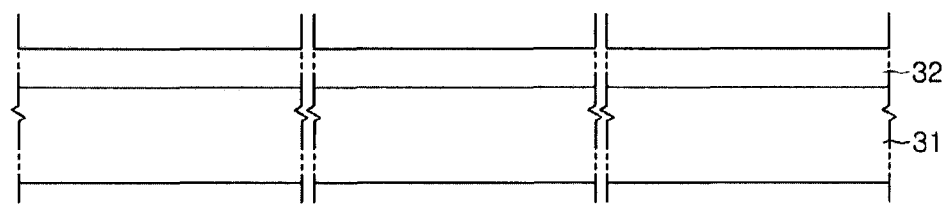
FIG. 19

NANOSTRUCTURE SEMICONDUCTOR LIGHT EMITTING DEVICE

CROSS-REFERENCE TO RELATED APPLICATION

This application is a continuation of U.S. patent application Ser. No. 14/833,832, filed on Aug. 24, 2015 with the U.S. Patent and Trademark Office, which claims the priority and benefit of Korean Patent Application No. 10-2014-0110721, filed on Aug. 25, 2014 with the Korean Intellectual Property Office, the disclosure of each of which is incorporated herein by reference.

BACKGROUND

The present disclosure relates to a nanostructure semiconductor light emitting device.

In recent years, as a new development in the area of semiconductor light emitting device technology, semiconductor light emitting devices using nanostructures have been developed. Semiconductor light emitting devices using nanostructures may have improved crystallinity, and/or may have active layers obtained from non-polar or semi-polar planes, thereby reducing or preventing luminous efficiency from deteriorating due to polarization. In addition, such nanostructure semiconductor light emitting devices can emit light through a significantly large surface area, resulting in improved luminous efficiency. However, problematic indium incorporation inside the active layers may be caused during a growth process, resulting in difficulties in emitting longer-wavelength light.

SUMMARY

An aspect of the present disclosure may provide a nanostructure semiconductor light emitting device having improved internal quantum efficiency and capable of converting the wavelength of emitted light into a relatively long wavelength.

BRIEF DESCRIPTION OF DRAWINGS

The above and other aspects, features and advantages of the present disclosure will be more clearly understood from the following detailed description taken in conjunction with the accompanying drawings, in which:

FIGS. 18A and 18B are graphs illustrating various examples of In change rates in a quantum well;

FIGS. 19 through 25 are cross-sectional views illustrating a method of manufacturing a nanostructure semiconductor light emitting device according to an example embodiment in the present disclosure;

DETAILED DESCRIPTION

Figure 1:
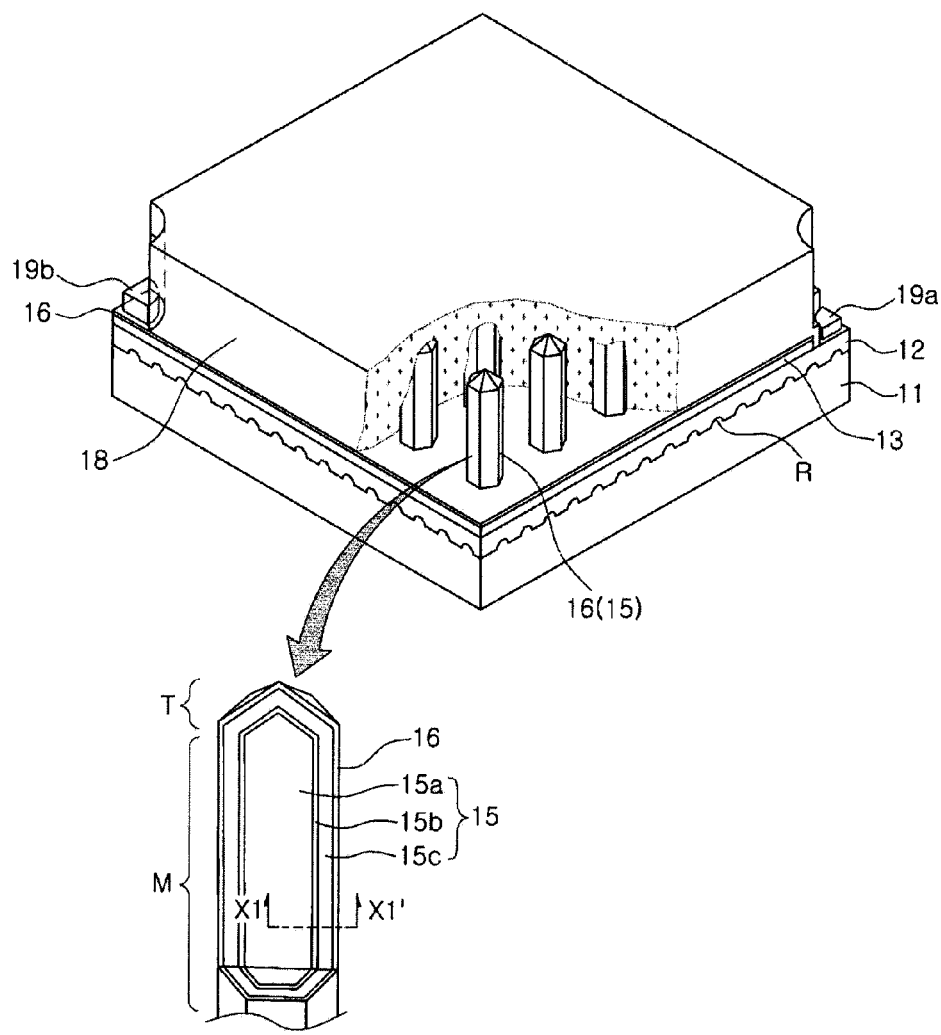
FIG. 1 is a schematic perspective view of a nanostructure semiconductor light emitting device according to at least one example embodiment in the present disclosure.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
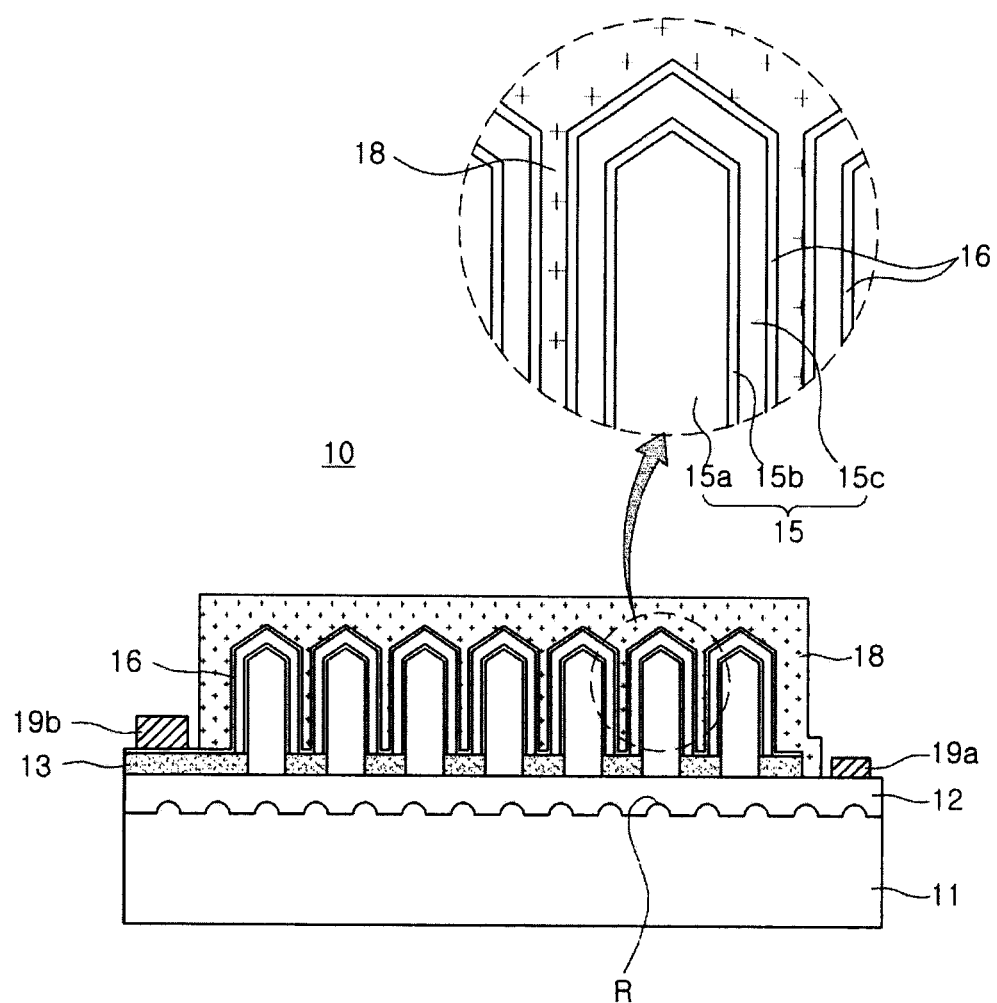
FIG. 2 is a cross-sectional view of the nanostructure semiconductor light emitting device illustrated in FIG. 1.

FIG. 1 is a schematic perspective view of a nanostructure semiconductor light emitting device according to an example embodiment in the present disclosure, and FIG. 2 is a cross-sectional view of the nanostructure semiconductor light emitting device illustrated in FIG. 1.

Referring to FIG. 1 together with FIG. 2, a nanostructure semiconductor light emitting device 10 may include a base layer 12 formed of a first conductivity-type semiconductor material and a plurality of light emitting nanostructures 15 disposed on the base layer 12.

The nanostructure semiconductor light emitting device 10 may include a substrate 11 having an upper surface on which the base layer 12 is disposed. A convex pattern including uneven portions R may be formed on the upper surface of the substrate 11. The uneven portions R may improve light extraction efficiency and/or the quality of a single crystal grown thereon. The substrate 11 may be an insulating substrate, a conductive substrate or a semiconductor substrate. For example, the substrate 11 may be formed of sapphire, SiC, Si, $MgAl_2O_4$, MgO, $LiALO_2$, $LiGaO_2$ or GaN.

The base layer 12 may include a first-conductivity type nitride semiconductor layer and may provide a growth surface for the light emitting nanostructures 15. The base layer 12 may be formed of a nitride semiconductor containing $Al_xIn_yGa_{1-x-y}N$ ($0 \le x < 1$, $0 \le y < 1$, $0 \le x+y < 1$) and may be doped with n-type impurities such as silicon (Si). For example, the base layer 12 may be an n-type GaN layer.

An insulating layer 13 having openings therein may be formed on the base layer 12 and the openings may be provided to facilitate growth of the light emitting nanostructures 15 (for example, nanocores 15a). Portions of the base layer 12 may be exposed through the openings and the nanocores 15a may be formed on the exposed portions of the base layer 12. The insulating layer 13 may be used as a mask for growth of the nanocores 15a. For example, the insulating layer 13 may be formed of an insulating material such as $SiO_2$ or $SiN_x$.

Each of the light emitting nanostructures 15 may include a main portion M having a hexagonal prism structure and a tip portion T disposed on the top of the main portion M. The main portion M of the light emitting nanostructure 15 may have side surfaces, each of which having a first crystal plane, and the tip portion T of the light emitting nanostructure 15 may have a second crystal plane different from the first crystal plane. The tip portion T of the light emitting nanostructure 15 may have a hexagonal pyramid structure. The shape of the light emitting nanostructure 15 may be determined depending on the shape of the nanocore 15a, and the structure of the nanocore 15a may be divided into the main portion M and the tip portion T.

The light emitting nanostructure 15 may include the nanocore 15a formed of a first conductivity-type semiconductor material, and an active layer 15b and a second conductivity-type semiconductor layer 15c sequentially formed on a surface of the nanocore 15a.

Figure 3:
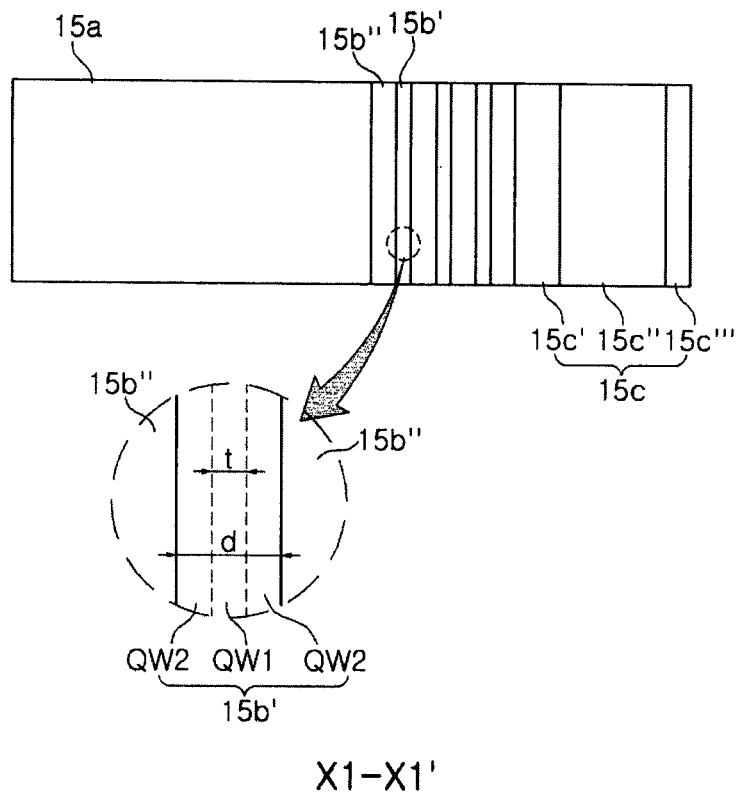
FIG. 3 is an enlarged view illustrating a stacked structure, taken along line X1-X1', in the nanostructure semiconductor light emitting device illustrated in FIGS. 1 and 2.

FIG. 3 is an enlarged view of a portion of the light emitting nanostructure of FIGS. 1 and 2, taken along line X1-X1', to illustrate a stacked structure.

The nanocore 15a may be formed of a nitride semiconductor containing $Al_xIn_yGa_{1-x-y}N$ ($0 \leq x<1$, $0 \leq y<1$, $0 \leq x+y<1$), similar to the base layer 12. For example, the nanocore 15a may be formed of n-type GaN.

The second conductivity-type semiconductor layer 15c may be formed of a nitride semiconductor containing p-type $Al_xIn_yGa_{1-x-y}N$ ($0 \leq x<1$, $0 \leq y<1$, $0 \leq x+y<1$), and may include a plurality of layers as necessary. The second conductivity-type semiconductor layer 15c may include a p-type AlGaN layer 15c', a p-type GaN layer 15c'' having low concentration of p-type impurities, and a p-type GaN layer 15c''' having a higher concentration of p-type impurities. The p-type AlGaN layer 15c' and the p-type GaN layer 15c''' having high concentration of p-type impurities may be provided as an electron blocking layer (EBL) and a contact layer, respectively.

As illustrated in FIG. 3, the active layer 15b used in the at least one example embodiment may have a multi-quantum well (MQW) structure in which a plurality of quantum wells 15b' and a plurality of quantum barriers 15b'' are alternately provided. The quantum wells 15b' may be formed of $In_{x1}Ga_{1-x1}N$ ($x_2<x_1<1$), and the quantum barriers 15b'' may be formed of $In_{x2}Ga_{1-x2}N$ ($0 \leq x_2<x_1$). For example, the quantum barriers 15b'' may be formed of GaN.

The quantum wells 15b' may be divided into a plurality of regions having different indium (In) composition ratios (x1) in a thickness direction thereof, based on the above formula. The term "indium (In) composition ratio(s)" may be also referred to "indium (In) content(s)". The quantum well 15b' used in the at least one example embodiment may be divided into a first region QW1 having a relatively high In composition ratio and second regions QW2 having a relatively low In composition ratio, and the first region QW1 may be disposed between the second regions QW2.

Figure 4:
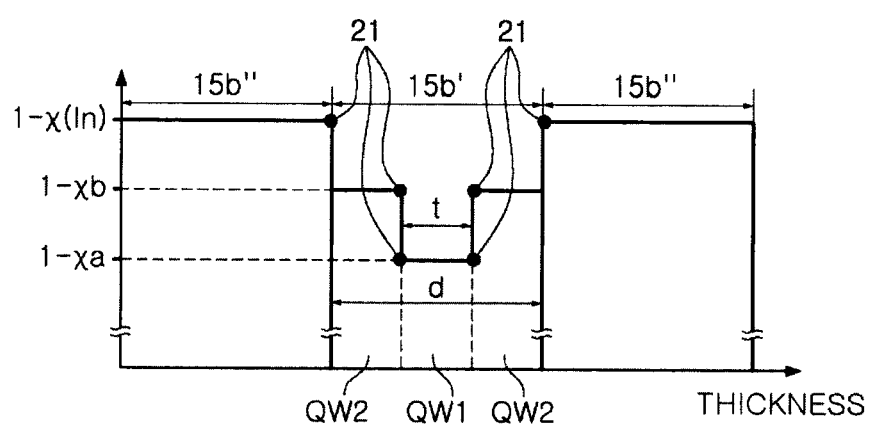
FIG. 4 is a graph illustrating indium (In) composition ratios in a thickness direction of an active layer used in the nanostructure semiconductor light emitting device illustrated in FIG. 1.

FIG. 4 is a graph illustrating In composition ratios in the thickness direction of the quantum well 15b' usable in the at least one example embodiment.

As illustrated in FIG. 4, the quantum well 15b' disposed between the quantum barriers 15b'' may have two regions, namely, the first and second regions QW1 and QW2 having different In composition ratios Xa and Xb. An In composition ratio Xa of the first region QW1 may be greater than an In composition ratio Xb of the second region QW2. By forming a single quantum well 15b' to have different In composition ratios, luminous efficiency may be improved. The In composition ratio Xa of the first region QW1 may be greater than an In composition ratio Xb of the second region QW2 by at least 5%, but the ratios are not limited thereto. As shown in FIG. 4, the In composition profile may be a stepped curve and partitioned into segments at inflection points 21. The inflection points 21 may be at exact intersections as shown in FIG. 4, or on more gradual curves, as shown later, for example, in FIG. 14, taking in account manufacturing techniques and/or allowable errors.

Because the quantum well 15b' has different In composition ratios regionally, it includes regions having different band gaps, but may emit light having a single peak wavelength. The quantum well 15b' according to at least one example embodiment may be useful in producing light having a relatively long wavelength (see experiment 1). In FIG. 4, the In composition ratio within the quantum well 15b' is illustrated as being uniform in each region in the thickness direction, but in actuality, it may be changed (increased or decreased) in the thickness direction, and the first and second regions QW1 and QW2 may be divided according to different change rates in the thickness direction. Details thereof will be provided with reference to FIGS. 17A to 17C and FIGS. 18A and 18B. The lighting emitting nanostructure includes not only "core-shell structure" but also "laminated structure", which can be shown in U.S. Pat. No. 8,212,266, issued Jul. 3, 2012, which is incorporated herein by reference in its entirety.

The effect of improving luminous efficiency resulting from the first region QW1 may be changed according to a thickness t of the first region QW1. The thickness t of the first region QW1 may range from 15% to 90% based on the overall thickness d of the quantum well 15b'.

The nanostructure semiconductor light emitting device 10 may include a contact electrode 16 connected to the second conductivity-type semiconductor layer 15c. The contact electrode 16 used in at least one example embodiment may be formed of a conductive material having light transmission properties. Such a contact electrode 16 may facilitate the emission of light in a direction opposite to the substrate. The contact electrode 16 may be formed of a transparent conductive oxide layer or a transparent conductive nitride layer, but is not limited thereto. For example, the contact electrode 16 may include at least one selected from the group consisting of indium tin oxide (ITO), zinc-doped indium tin oxide (ZITO), zinc indium oxide (ZIO), gallium indium oxide (GIO), zinc tinoxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, where $0 \leq x \leq 1$). As necessary, the contact electrode 16 may include graphene.

The contact electrode 16 is not limited to the light transmissive material, and may have a reflective electrode structure as necessary. For example, the contact electrode 16 may include silver (Ag), nickel (Ni), aluminum (Al), rhodium (Rh), palladium (Pd), iridium (Jr), ruthenium (Ru), magnesium (Mg), zinc (Zn), platinum (Pt), gold (Au), and the like, and may have two or more layers formed of Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. By employing such a reflective electrode structure, a flip-chip structure may be realized.

An insulating protective layer 18 may be formed on the top of the light emitting nanostructures 15. The insulating protective layer 18 may serve as a passivation layer protecting the light emitting nanostructures 15. The insulating protective layer 18 may be formed of a light transmissive material so as to allow light generated in the light emitting nanostructures 15 to be extracted externally. In at least one example embodiment, by selecting a material for the insulating protective layer 18 having an appropriate refractive index, light extraction efficiency may be enhanced.

As in the at least one example embodiment, after the contact electrode 16 is formed, the insulating protective layer 18 may be formed to fill spaces between the plurality of light emitting nanostructures 15. The insulating protective layer 18 may be formed of an insulating material such as $SiO_2$ or $SiN_x$. For example, the insulating protective layer 18 may include tetraethylorthosilane (TEOS), borophospho silicate glass (BPSG), CVD-$SiO_2$, spin-on glass (SOG), or spin-on dielectric (SOD).

The present inventive concepts are not limited to the use of the insulating protective layer 18 for filling the spaces between the plurality of light emitting nanostructures 15. For example, in other example embodiments, the spaces between the plurality of light emitting nanostructures 15 may be filled with an electrode material (e.g., a reflective electrode material) like the contact electrode 16.

The nanostructure semiconductor light emitting device 10 may include first and second electrodes 19a and 19b. The first electrode 19a may be disposed on an exposed region of the base layer 12 formed of the first conductivity-type semiconductor material. In addition, the second electrode 19b may be disposed on an extended and exposed region of the contact electrode 16. The arrangement of the electrodes is not limited thereto, and different arrangements thereof may be used according to the use environment.

The quantum wells used in at least one example embodiment may be employed in various types of nanostructure semiconductor light emitting device. As an example, a multi-wavelength semiconductor light emitting device having three groups of light emitting nanostructures is illustrated in FIG. 5, and FIG. 6 is a side cross-sectional view of the nanostructure semiconductor light emitting device of FIG. 5, taken along line X2-X2'.

Figure 5:
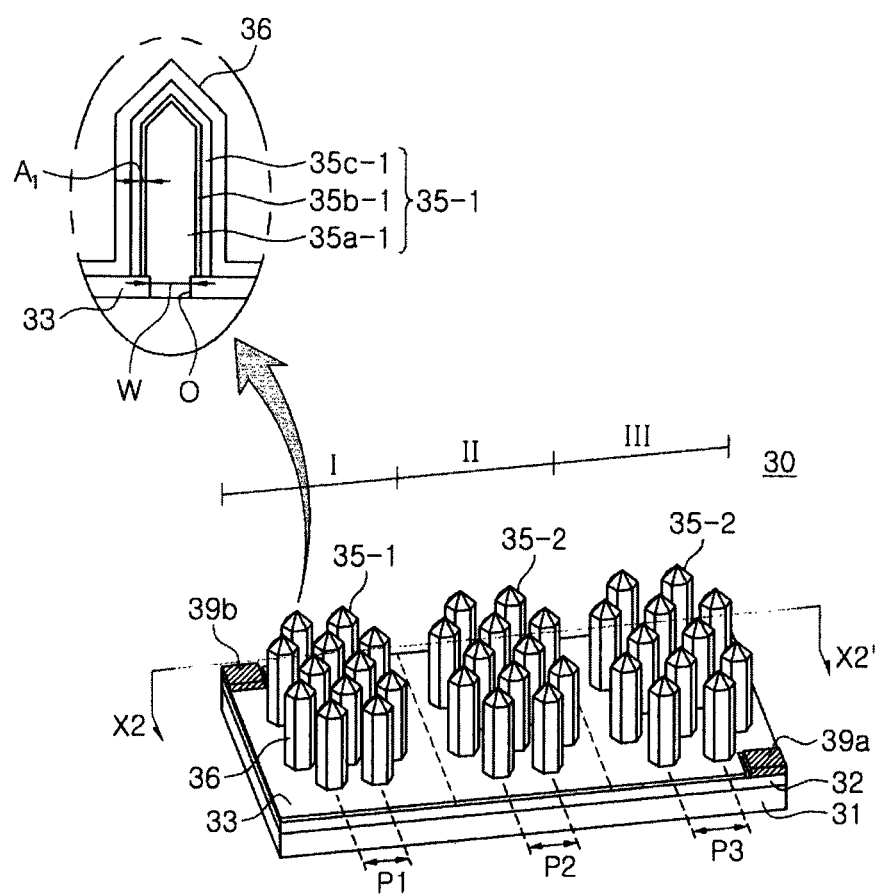
FIG. 5 is a schematic perspective view of a nanostructure semiconductor light emitting device according to at least one example embodiment in the present disclosure.
Figure 6:
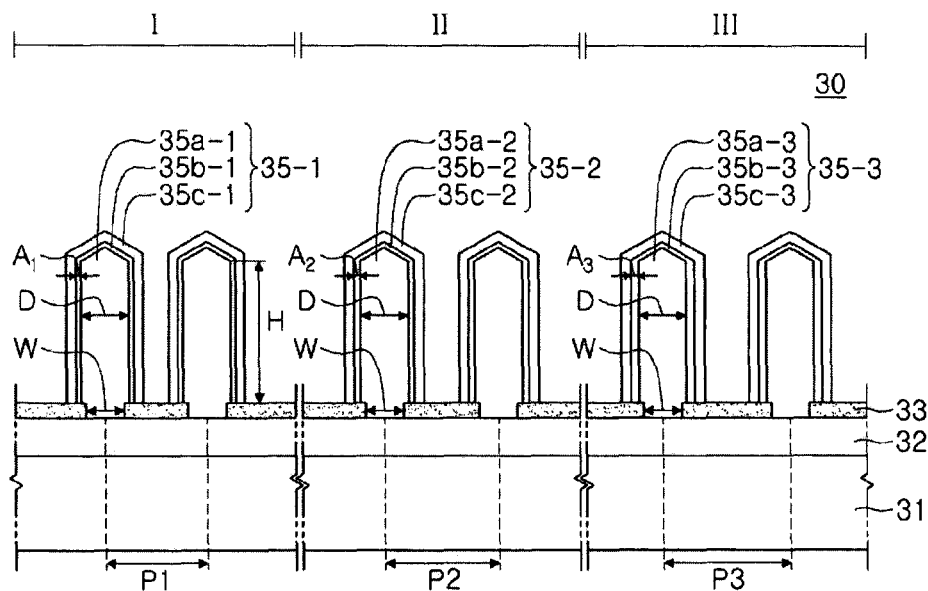
FIG. 6 is a cross-sectional view of the nanostructure semiconductor light emitting device illustrated in FIG. 5, taken along line X2-X2'.

A nanostructure semiconductor light emitting device 30 illustrated in FIG. 5 may include a base layer 32 formed of a first conductivity-type semiconductor material and three groups of light emitting nanostructures 35-1, 35-2 and 35-3 disposed on the base layer 32.

The nanostructure semiconductor light emitting device 30 may include a substrate 31 having an upper surface on which the base layer 12 is disposed. The substrate 31 may be an insulating substrate, a conductive substrate, or a semiconductor substrate. For example, the substrate 31 may be formed of sapphire, SiC, Si, $MgAl_2O_4$, MgO, $LiALO_2$, $LiGaO_2$, or GaN.

The base layer 32 may provide a growth surface for the light emitting nanostructures 35-1, 35-2 and 35-3. The base layer 32 may be formed of a nitride semiconductor containing $Al_xIn_yGa_{1-x-y}N$ (0≤x<1, 0≤y<1, and 0≤x+y<1) and may be doped with impurities. For example, the base layer 32 may be a GaN layer doped with n-type impurities such as silicon (Si).

Figure 7:
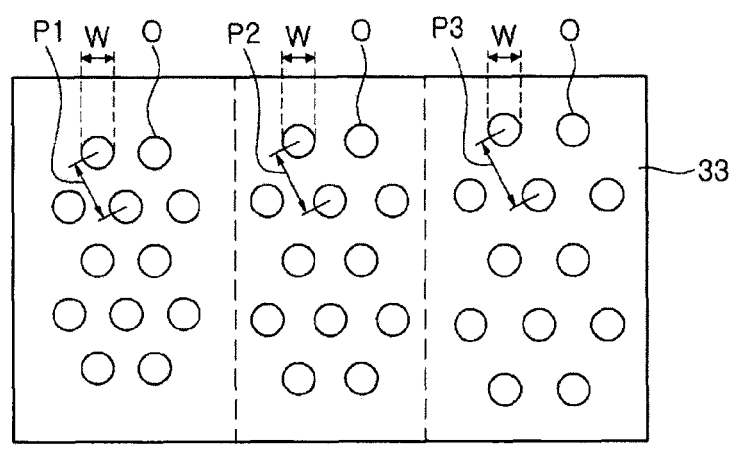
FIG. 7 is a plan view illustrating a pattern of openings in a mask usable in the example embodiment of FIG. 5.

As illustrated in FIG. 6, an insulating layer 33 may have a plurality of openings O for the growth of nanocores 35a. The insulating layer 33 may be formed of an insulating material such as $SiO_2$ or $SiN_x$ which is usable in a semiconductor process. FIG. 7 illustrates the insulating layer 33 as a mask usable in at least one example embodiment. The openings O of the insulating layer 33 may be formed to have the same width W while having different pitches $P_1<P_2<P_3$ in first to third regions I, II and III.

The light emitting nanostructures 35-1, 35-2 and 35-3 may include nanocores 35a-1, 35a-2 and 35a-3 formed of the first conductivity-type semiconductor material, and active layers 35b-1, 35b-2 and 35b-3 and second conductivity-type semiconductor layers 35c-1, 35c-2 and 35c-3 sequentially formed on the surfaces of the nanocores 35a-1, 35a-2 and 35a-3, respectively.

The nanocores 35a-1, 35a-2 and 35a-3 may have the same size (for example, the same diameter D) while being arranged to have different pitches $P_1<P_2<P_3$ in the first to third regions I, II and III, respectively. In an example embodiment in which the insulating layer 33 illustrated in FIG. 7 is used as a mold mask (see FIGS. 20 and 21) for the growth of the nanocores, the nanocores are grown in the openings having the same width W, and thus the nanocores 35a-1, 35a-2 and 35a-3 may have substantially the same diameter D in the first to third regions I, II and III, while having different pitches $P_1<P_2<P_3$. In at least one example embodiment, there may be differences in heights of the nanocores 35a-1, 35a-2 and 35a-3. The nanocores 35a-1, 35a-2 and 35a-3 may be formed of a nitride semiconductor containing $Al_xIn_yGa_{1-x-y}N$ (0≤x<1, 0≤y<1, and 0≤x+y<1), similar to the base layer 32. For example, the nanocores 35a-1, 35a-2 and 35a-3 may be formed of n-type GaN.

Each of the active layers 35b-1, 35b-2 and 35b-3 may have a multi-quantum well (MQW) structure in which a plurality of quantum wells and a plurality of quantum barriers are alternately provided. For example, the active layers 35b-1, 35b-2 and 35b-3 may have a GaN/InGaN MQW structure. In other example embodiments, the active layers 35b-1, 35b-2 and 35b-3 may have a single quantum well (SQW) structure.

The light emitting nanostructures used in at least one example embodiment may be divided into three groups, namely, first to third groups of light emitting nanostructures 35-1, 35-2 and 35-3, according to pitches $P_1$, $P_2$ and $P_3$ of the nanocores 35a-1, 35a-2 and 35a-3.

The first to third groups of light emitting nanostructures 35-1, 35-2 and 35-3 may be disposed in the first to third regions I, II and III on the upper surface of the base layer 32, respectively. In at least one example embodiment, the three divided regions I, II and III are arranged in parallel by way of example, but the arrangement thereof is not limited thereto. The regions may be defined by various arrangements and various areas.

In at least one example embodiment, the active layers 35b-1, 35b-2 and 35b-3 may include quantum wells having different thicknesses so as to emit light having different wavelengths. In general, the thicknesses of quantum wells are adjusted by growth process conditions such as temperature, pressure, source flow and the like; however, even under the same growth conditions, the quantum wells may be formed to have different thicknesses by using different pitches. In at least one example embodiment, when the active layers 35b-1, 35b-2 and 35b-3 (especially, the quantum wells) are grown on the nanocores 35a-1, 35a-2 and 35a-3 in all of the groups even under the same growth conditions, the active layers 35b-1, 35b-2 and 35b-3 may be formed to have different thicknesses $A_1<A_2<A_3$ in respective regions I, II and III in which the nanocores 35a-1, 35a-2 and 35a-3 are arranged to have different pitches $P_1$, $P_2$ and $P_3$. That is, as the pitches $P_1<P_2<P_3$ of the nanocores are increased, the thicknesses $A_1<A_2<A_3$ of the active layers, especially, the thicknesses of the quantum wells, may be increased.

In addition, the quantum wells in at least one example embodiment may be formed by varying the supply of indium (or different indium incorporation conditions), and thus it may include regions having different In composition ratios in the thickness direction thereof. Furthermore, the active layers in each group may be formed in the same growth process, and thus they have similar In composition ratios in the thickness direction thereof.

Figure 8A:
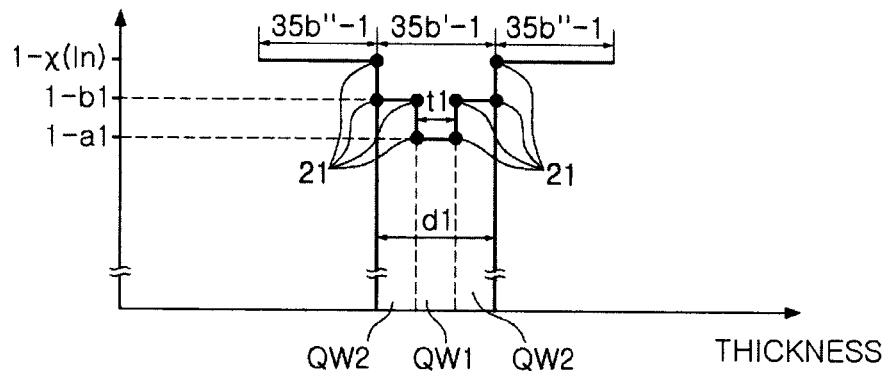
FIGS. 8A through 8C are graphs illustrating In composition ratios in a thickness direction of active layers used for respective groups in the nanostructure semiconductor light emitting device illustrated in FIG. 5.
Figure 8B:
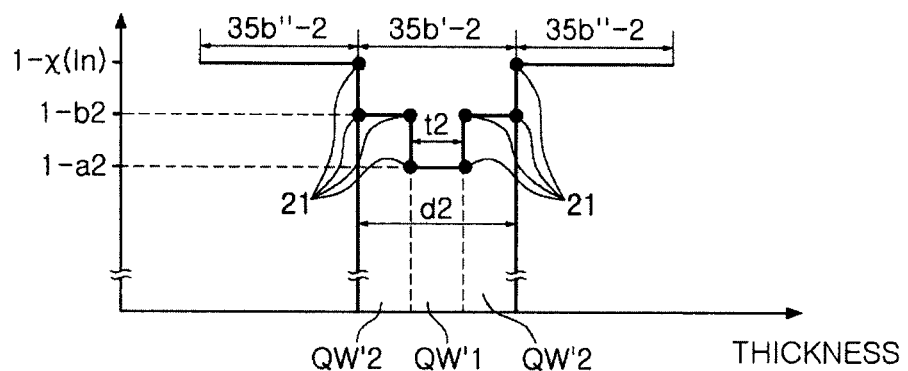
Figure 8C:
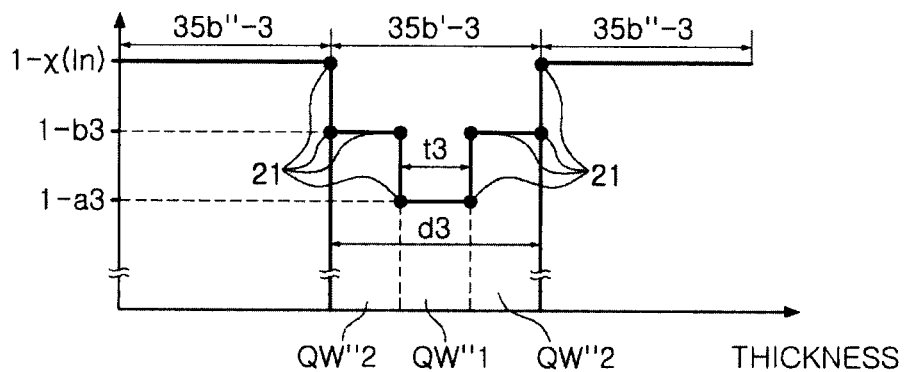

FIGS. 8A through 8C are graphs illustrating an In composition profile in the active layers (especially, the quantum wells) for respective groups.

As illustrated in FIGS. 8A through 8C, quantum barriers 35b"-1, 35b"-2 and 35b"-3 as well as quantum wells 35b'-1, 35b'-2 and 35b'-3 in three respective groups may have different thicknesses due to pitch differences. The quantum wells 35b'-1, 35b'-2 and 35b'-3 may include first regions QW1, QW1' and QW1" having a relatively high In composition ratio and second regions QW2, QW2' and QW2" disposed on both sides of the first regions and having a relatively low In composition ratio, respectively. As shown in FIGS. 8A-8C, the In composition profile may be a stepped curve and partitioned into segments at inflection points 21. The inflection points 21 may be at exact intersections as shown in FIGS. 8A-8C, or on more gradual curves, as shown later, for example, in FIG. 14, taking in account manufacturing techniques and/or allowable errors.

In an actual process, even when the quantum wells 35b'-1, 35b'-2 and 35b'-3 are grown under the same growth conditions, the quantum wells 35b'-1, 35b'-2 and 35b'-3 have different thicknesses $d_1<d_2<d_3$ due to pitch differences. Likewise, the first regions QW1, QW1' and QW1" may also have different thicknesses $t_1<t_2<t_3$.

In at least one example embodiment in which the thicknesses of the quantum wells are varied according to pitches, a relatively thick quantum well may have a higher In content than a relatively thin quantum well. In at least one example embodiment, as illustrated in FIGS. 8A through 8C, even when the quantum wells 35b'-1, 35b'-2 and 35b'-3 are grown under the same growth conditions, the first regions QW1, QW1' and QW1" may have different In composition ratios a1<a2<a3. Likewise, the second regions QW2, QW2' and QW2" may also have different In composition ratios b1<b2<b3. However, the quantum barriers 35b"-1, 35b"-2 and 35b"-3 are formed of GaN in the present exemplary embodiment, and thus, the quantum barriers 35b"-1, 35b"-2 and 35b"-3 may be grown with different thicknesses, but may not have any change in In composition ratios.

Thus, the second group of light emitting nanostructures 35-2 may emit light having a longer wavelength than that of light emitted from the first group of light emitting nanostructures 35-1, and the third group of light emitting nanostructures 35-3 may emit light having a longer wavelength than that of light emitted from the second group of light emitting nanostructures 35-2. In this manner, a multi-wavelength light emitting device in which respective groups of light emitting nanostructures emit light having different wavelengths may be provided. Furthermore, such a multi-wavelength light emitting device may be provided as a white light emitting device. For example, the active layers 35b-1, 35b-2 and 35b-3 in the first to third groups may be designed to emit blue, green and red light, respectively. The wavelength of light emitted from the active layers 35b-1 in the first group may range from approximately 430 nm to 480 nm; the wavelength of light emitted from the active layers 35b-2 in the second group may range from approximately 480 nm to 540 nm; and the wavelength of light emitted from the active layers 35b-3 in the third group may range from approximately 540 nm to 630 nm.

In particular, respective groups of light emitting nanostructures 35-1, 35-2 and 35-3 used in at least one example embodiment may emit light having different wavelengths, and may have different In composition ratios within the quantum wells 35b'-1, 35b'-2 and 35b'-3, whereby a relatively long wavelength of light may be achieved in the group of light emitting nanostructures having a relatively large pitch. Such a long-wavelength effect may further increase differences between the wavelengths of light emitted from the respective groups of light emitting nanostructures. That is, a greater wavelength difference may be realized as compared to a wavelength difference obtained by only adjusting the pitches. As a result, the emission of light satisfying wavelength conditions for producing white light may be achieved.

The second conductivity-type semiconductor layers 35c-1, 35c-2 and 35c-3 may be formed of a nitride semiconductor containing p-type $Al_xIn_yGa_{1-x-y}N$ ($0 \leq x<1$, $0 \leq y<1$, and $0 \leq x+y<1$). In example embodiments, each of the second conductivity-type semiconductor layers 35c-1, 35c-2 and 35c-3 may include a p-type AlGaN layer (EBL) and a p-type GaN layer. The second conductivity-type semiconductor layers 35c-1, 35c-2 and 35c-3 may also have different thicknesses due to differences in the pitches $P_1<P_2<P_3$ in respective regions I, II and III.

A contact electrode 36 used in at least one example embodiment may include an ohmic-contact material making ohmic-contact with the second conductivity-type semiconductor layers 35c-1, 35c-2 and 35c-3. For example, the contact electrode 36 may include at least one of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au), and may have a single layer structure or a multilayer structure. The contact electrode 36 may be formed of a transparent conductive material, but is not limited thereto. The contact electrode 36 may be formed of a transparent conductive oxide layer or a transparent conductive nitride layer.

The nanostructure semiconductor light emitting device 30 may include first and second electrodes 39a and 39b. The first electrode 39a may be disposed on an exposed region of the base layer 32. In addition, the second electrode 39b may be disposed on an extended and exposed region of the contact electrode 36.

In the nanostructure semiconductor light emitting device 30 illustrated in FIGS. 5 and 6, each of the quantum wells may include a plurality of regions having different In composition ratios, thereby achieving higher luminous efficiency and/or realizing a larger wavelength difference between the wavelengths of light emitted from the active layers in respective groups, and thus may be useful for providing various types of multi-wavelength light emitting device including a white light emitting device.

In the nanostructure semiconductor light emitting device 30 illustrated in FIGS. 5 and 6, the thicknesses of the active layers, namely, the thicknesses of the quantum wells may be adjusted by varying the pitches of the nanocores related to the arrangement of the nanocores. In at least one other example embodiment, by adjusting the sizes of the nanocores, namely, at least one of diameters $D_n$ and heights $H_n$ of the nanocores or by adjusting the above parameter(s) together with pitches $P_n$, the active layers may be formed to emit light having different wavelengths even in the same growth process. At least one such example embodiment will be described with reference to FIG. 9 below.

Figure 9:
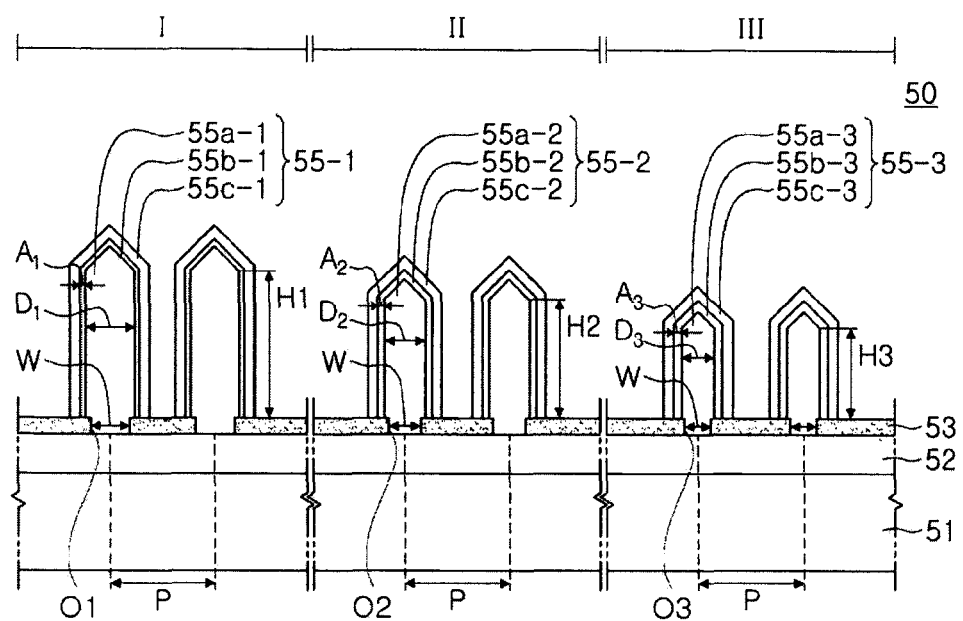
FIG. 9 is a cross-sectional view of a nanostructure semiconductor light emitting device according to at least one example embodiment in the present disclosure.

Similar to the example embodiments of FIG. 6, a nanostructure semiconductor light emitting device 50 illustrated in FIG. 9 may include a base layer 52 formed of a first conductivity-type semiconductor material and a plurality of light emitting nanostructures 55-1, 55-2 and 55-3 disposed on the base layer 52.

The nanostructure semiconductor light emitting device 50 may include a substrate 51 having an upper surface on which the base layer 52 is disposed. The base layer 52 may provide a growth surface for the light emitting nanostructures 55-1, 55-2 and 55-3. An insulating layer 53 may have a plurality of openings O1, O2 and O3 for the growth of nanocores 55a-1, 55a-2 and 55a-3. In at least one example embodiment, the plurality of openings O1, O2 and O3 may have different widths w1>w2>w3.

The light emitting nanostructures used in at least one example embodiment may be divided into three groups, namely, first to third groups of light emitting nanostructures 55-1, 55-2 and 55-3, according to the sizes of the nanocores 55a-1, 55a-2 and 55a-3. The first to third groups of light emitting nanostructures 55-1, 55-2 and 55-3 may be disposed on the three divided regions I, II and III on the upper surface of the base layer 52, respectively. As illustrated in FIG. 9, the nanocores 55a-1, 55a-2 and 55a-3 in the first to third groups may be formed to have different diameters $D_1>D_2>D_3$ and different heights $H_1>H_2>H_3$.

Active layers 55b-1, 55b-2 and 55b-3 and second conductivity-type semiconductor layers 55c-1, 55c-2 and 55c-3 may be formed on the surfaces of the nanocores 55a-1, 55a-2 and 55a-3 in the first to third groups, respectively. As illustrated in FIGS. 8A through 8C, the active layers 55b-1, 55b-2 and 55b-3 may include quantum wells, each of which has a plurality of regions having different In composition ratios. Descriptions of the preceding example embodiments may be combined with descriptions of the present example embodiments, unless otherwise specified.

In at least one example embodiment, the active layers 55b-1, 55b-2 and 55b-3 may include the quantum wells having different thicknesses so as to emit light having different wavelengths. As illustrated in FIG. 9, by varying diameters $D_n$ and heights $H_n$ of the nanocores 55a-1, 55a-2 and 55a-3, the quantum wells may be grown with different thicknesses even in the same growth process. As the diameters and heights of the nanocores 55a-1, 55a-2 and 55a-3 are increased, the active layers 55b-1, 55b-2 and 55b-3 grown on the surfaces of the nanocores 55a-1, 55a-2 and 55a-3, respectively, may have reduced thicknesses $A_1<A_2<A_3$. For example, the quantum wells of the active layers 55b-2 in the second group may be thicker than the quantum wells of the active layers 55b-1 in the first group and may be thinner than the quantum wells of the active layers 55b-3 in the third group.

Similar to example embodiments in which the pitches are varied, even when the active layers 55b-1, 55b-2 and 55b-3 are grown under the same process conditions, the active layers 55b-1, 55b-2 and 55b-3 in respective groups may include the quantum wells having different thicknesses and different In composition ratios. As a result, the active layers 55b-1, 55b-2 and 55b-3 may emit light having different wavelengths, and thus, the nanostructure semiconductor light emitting device 50 may provide white light through a combination of light having different wavelengths.

In order to verify the operations and effects according to at least one example embodiment, experiments were carried out by using two types of active layers grown in the same growth process and emitting light having different wavelengths.

EXPERIMENT 1 (SIMULATION)

Blue and Green Active Layers (Use of Nanocore Pitches)

Figure 10A:
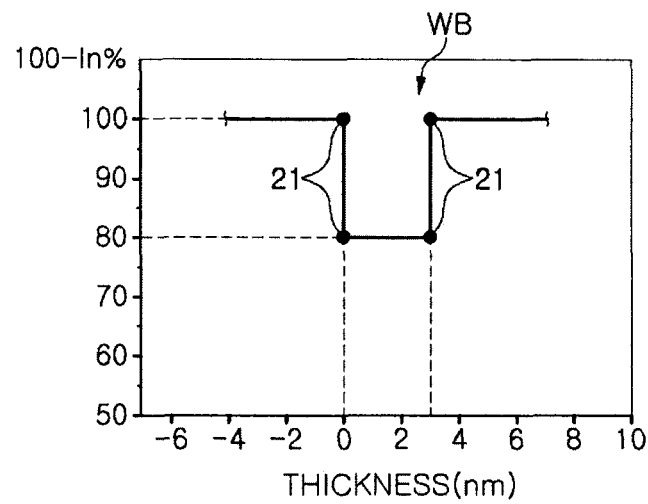
FIGS. 10A and 10B are graphs illustrating In composition ratios in a thickness direction of blue and green active layers used in a nanostructure semiconductor light emitting device according to comparative example 1.
Figure 10B:
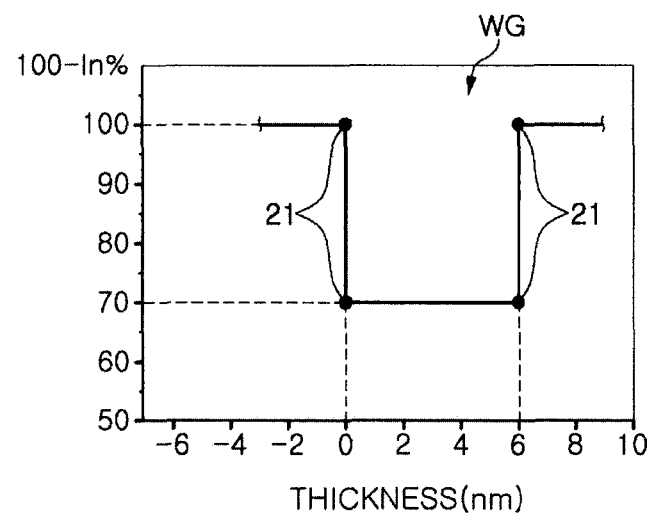

A nanostructure semiconductor light emitting device according to comparative example 1 was designed to include two groups of light emitting nanostructures respectively emitting blue light (peak wavelength: approximately 441 nm) and green light (peak wavelength: approximately 516 nm) by varying pitch conditions. Active layers of the two groups, grown under the same process conditions, exhibited an In composition profile illustrated in FIGS. 10A and 10B in the thickness direction thereof.

According to inventive example 1, In composition ratios in quantum wells were designed to have a stepped curve. At this time, In composition ratios in quantum wells of blue active layers (first group) having a relatively small pitch were calculated to allow a peak wavelength of blue light to be closest to that of blue light in comparative example 1. In addition, under the same process conditions, In composition ratios in quantum wells of green active layers (second group) having a relatively large pitch were calculated. Here, respective pitch conditions in the two groups according to inventive example 1 were the same as the corresponding ones according to comparative example 1. As a result, the active layers in inventive example 1 exhibited an In composition profile illustrated in FIGS. 11A and 11B, while the stepped curve was shown in the quantum wells. As shown in FIGS. 10A-11B, the In composition profile may be a stepped curve and partitioned into segments at inflection points 21. The inflection points 21 may be at exact intersections as shown in FIGS. 10A-11B, or on more gradual curves, as shown later, for example, in FIG. 14, taking in account manufacturing techniques and/or allowable errors.

With respect to comparative example 1 and inventive example 1, driving voltage, internal quantum efficiency and wavelength differences were calculated, and the results are shown in table 1.

TABLE 1

| | Group | Peak Wavelength (nm) | Quantum Well (Thickness, In Composition Ratio) | Driving Voltage (@100 mA) | Internal Efficiency | Wavelength Difference (nm) |
|---|---|---|---|---|---|---|
| Comparative Example 1 | Blue Group | 441 | 3 nm, 20% | 3 | 54% | 75 |
| | Green Group | 516 | 6 nm, 30% | 2.88 | 35% | |

TABLE 1-continued

| Group | | Peak Wavelength (nm) | Quantum Well (Thickness, In Composition Ratio) | Driving Voltage (@100 mA) | Internal Efficiency | Wavelength Difference (nm) |
|---|---|---|---|---|---|---|
| Inventive Example 1 | Blue Group | 438 | 1/1/1 nm, 14%/24% | 2.96 | 59% | 92 |
| | Green Group | 530 | 2/2/2 nm, 21%/36% | 2.82 | 47% | |

Figure 11A:
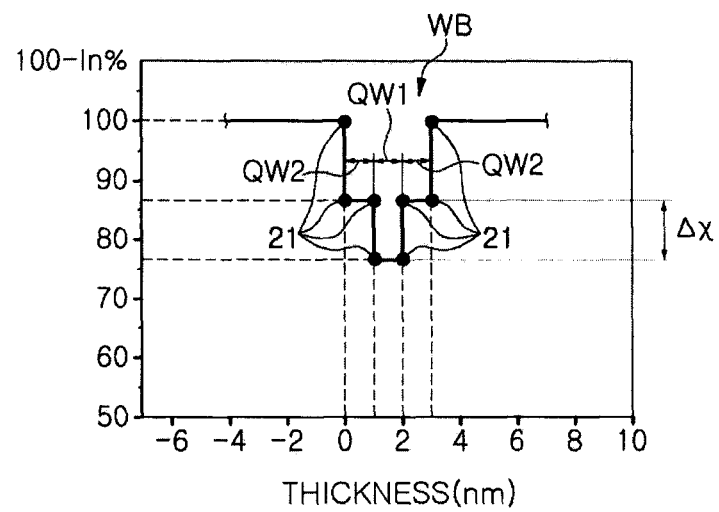
FIGS. 11A and 11B are graphs illustrating In composition ratios in a thickness direction of blue and green active layers used in a nanostructure semiconductor light emitting device according to inventive example 1.
Figure 11B:
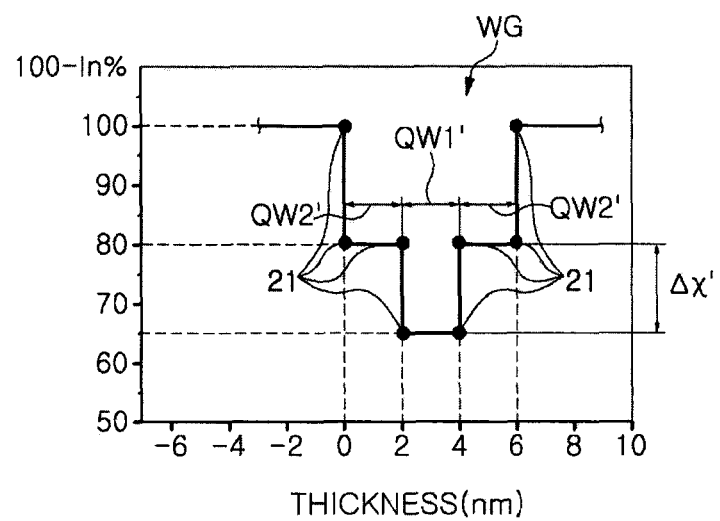

As shown in table 1, in inventive example 1 having the In composition profile illustrated in FIGS. 11A and 11B, it can be seen that driving voltage and internal quantum efficiency were significantly improved. In particular, when the wavelength conditions of blue light and the pitch conditions were the same, the peak wavelength of green light emitted from the active layers grown under the same conditions was further increased by using the quantum wells each including a plurality of regions having different In composition ratios as illustrated in FIGS. 11A and 11B. As a result, a difference between the peak wavelength of blue light and the peak wavelength of green light in comparative example 1 was 75 nm, while a peak wavelength difference in inventive example 1 was significantly increased to 92 nm.

In a case in which a multi-wavelength light emitting device is manufactured by adjusting the pitches and sizes of the nanocores, the design of different In composition ratios (or In contents) within quantum wells may ensure internal quantum efficiency and a sufficiently large wavelength difference, thereby being useful for the manufacturing of the multi-wavelength light emitting device providing white light.

EXPERIMENT 2

Control of in Composition Ratios within Quantum Well

Two samples according to inventive example 2 and comparative example 2 were manufactured in a manner similar to that of experiment 1. Light emitting nanostructures of each sample were divided into two groups of light emitting nanostructures emitting blue light and green light, respectively, by varying the pitches of the nanocores. Here, respective pitch conditions in the two groups according to inventive example 2 were the same as the corresponding ones according to comparative example 2.

Quantum wells in inventive example 2 and comparative example 2 were grown under different temperature conditions so as to have different In composition ratios. Specifically, each quantum well in comparative example 2 was grown to have 4 nm at the same temperature WT so as to substantially uniformize In composition ratios within the corresponding quantum well, while each quantum well in inventive example 2 was grown at a relatively high temperature (WT+5° C.), was then grown at a decreased temperature (WT−10° C.), and was grown again at the previously high temperature (WT+5° C.) so as to be divided into regions having different In composition ratios. In inventive example 2, the corresponding quantum well was grown to have thicknesses of 1.6/0.8/1.6 nm in the respective temperature sections. In experiment 2, the source supply and temperature conditions were adjusted to allow a peak wavelength of blue light in the two samples to be substantially the same (about 448 nm).

Figure 12:
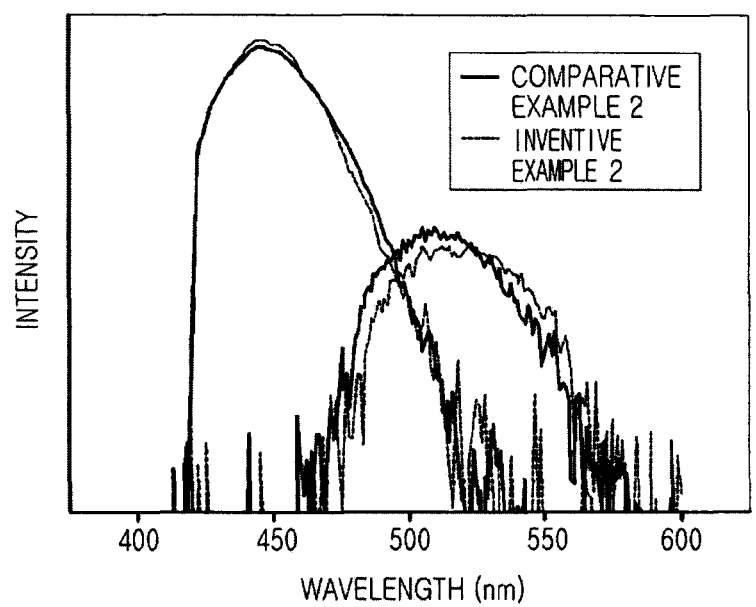
FIG. 12 is a graph illustrating photo-luminance results of blue and green active layers used in nanostructure semiconductor light emitting devices according to inventive example 2 and comparative example 2.

The wavelengths of the samples were measured and a difference therebetween is shown in table 2 and FIG. 12. Referring to table 2 together with FIG. 12, as compared to comparative example 2 having the same wavelength of blue light and the same pitch conditions, the wavelength of green light may be further increased in inventive example 2. As a result, it can be seen that a difference between the wavelength of blue light and the wavelength of green light was significantly increased from 63 nm to 71 nm by 8 nm.

TABLE 2

| | Quantum Well Growth Temperature (Thickness: nm) | Blue | Green | Wavelength Difference |
|---|---|---|---|---|
| Comparative Example 2 | WT (4) | 448 nm | 511 nm | 63 |
| Inventive Example 2 | WT + 5° C. (1.6)/ WT − 10° C. (0.8)/ WT + 5° C. (1.6) | 448 nm | 519 nm | 71 |

Through experiment 2, it can be seen that the quantum well was grown to include regions having different In composition ratios by varying the In composition ratios using the growth temperatures. Specifically, since In is volatile, an In incorporation rate within the quantum well depends on temperature. Therefore, the In incorporation rate may be increased by only lowering the temperature under the same growth conditions, and as a result, a region having a relatively high In composition ratio may be obtained in the corresponding temperature section.

Figure 13A:
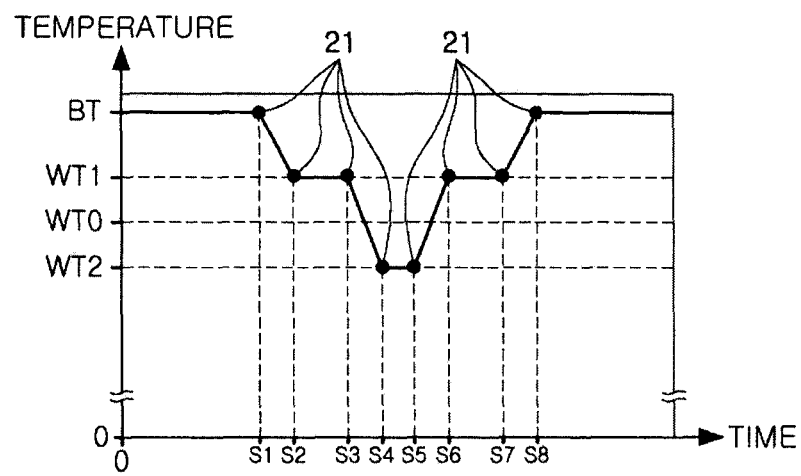
FIGS. 13A and 13B are time charts related to the control of growth temperature and source gas flow in a process of growing quantum wells usable in at least one example embodiment in the present disclosure.
Figure 13B:
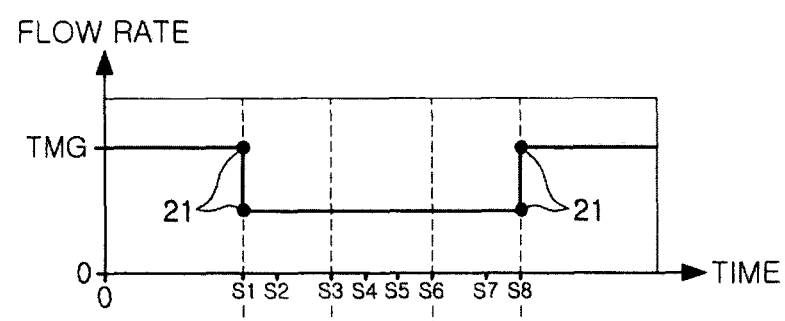
Figure 13B:
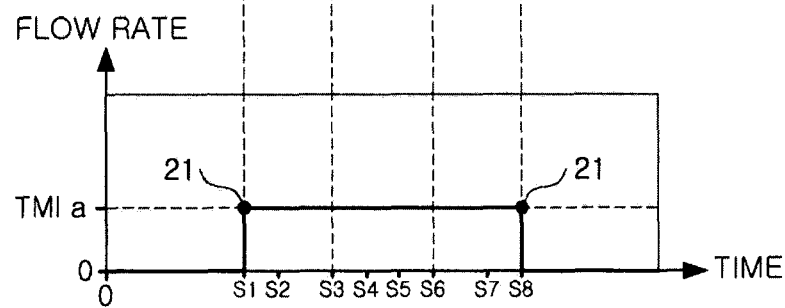

FIGS. 13A and 13B are time charts related to the control of growth temperature and source gas flow in a process of growing quantum wells usable in example embodiments.

Referring to FIGS. 13A and 13B, in a growth section 0-S1 of a GaN quantum barrier, trimethylgallium (TMG) together with $NH_3$ may be supplied at a predetermined and/or desired flow rate, while a relatively high growth temperature BT may be maintained. Subsequently, in growth sections S1-S8 of a quantum well, the flow rate of TMG may be reduced and trimethylindium (TMI) may be supplied at a predetermined and/or desired flow rate. In at least one example embodiment, temperature may be used in order to obtain a region having a relatively high In composition ratio (see sections S3-S6 of FIG. 14).

For example, in the growth sections S1-S8 of the quantum well, the source gas flow may be uniformly maintained as illustrated in FIG. 13B, while the growth temperature may be changed as illustrated in FIG. 13A, as follows: the growth temperature may be decreased to WT1 in section S1-S2 and may be maintained at WT1 in section S2-S3; the growth temperature may be decreased to WT2 in section S3-S4 in order to increase an In composition ratio and may be maintained at WT2 in section S4-S5; the growth temperature may be increased to WT1 in section S5-S6 and may be maintained at WT1 in section S6-S7; and the growth temperature may be increased to BT in section S7-S8 in order to grow a quantum barrier. As shown in FIGS. 13A-13B, the In composition profile may be a stepped curve and partitioned into segments at inflection points 21. The inflection points 21 may be at exact intersections as shown in FIGS. 13A-13B, or on more gradual curves, as shown later, for example, in FIG. 14, taking in account manufacturing techniques and/or allowable errors.

Figure 14:
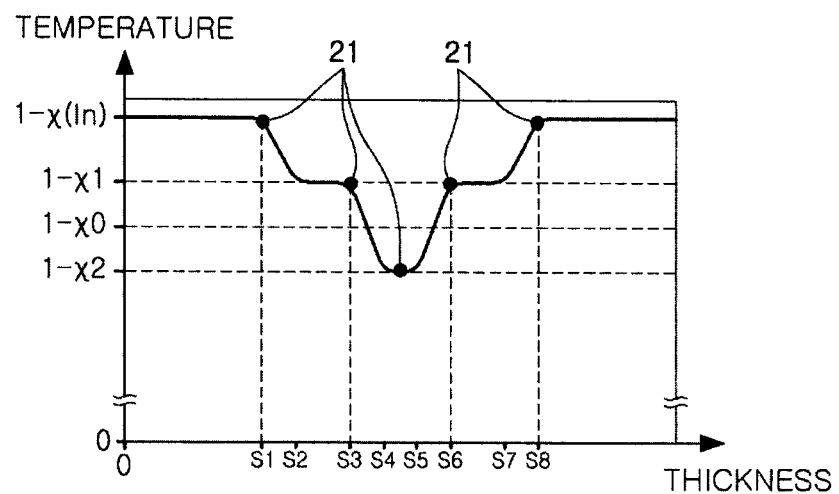
FIG. 14 is a graph illustrating In change rates in the quantum well of FIGS. 13A and 13B.

Such growth temperature changes may result in an In composition profile of the quantum well illustrated in FIG. 14. A first region corresponding to sections S3-S6 having a relatively high In composition ratio may be disposed between second regions corresponding to sections S1-S3 and S6-S8 having a relatively low In composition ratio.

In actuality, as illustrated in FIG. 14, the In composition profile may be exhibited at predetermined and/or desired gradients, separated by inflection points 21, according to the increase and decrease of In composition ratios. Due to the time elapsed in a case in which changes in process conditions such as the increase or decrease of temperature affect actual In incorporation, the In composition profile may be represented by gradients reflecting In change rates in the thickness direction of the active layer. In the case of using such change rates, the division of regions may be determined according to change rates of In composition ratios. Details thereof will be provided with reference to FIGS. 17A to 17C and FIGS. 18A and 18B.

EXPERIMENT 3 (SIMULATION)

Thickness of First Region within Quantum Well

In a group of short-wavelength light emitting nanostructures, each quantum well was designed to have a 10% difference between In composition ratios of first and second regions and to emit light having a peak wavelength of 440 nm.

InGaN quantum well structures emitting light having a short wavelength of 440 nm were designed by maintaining the overall thickness d thereof as 1.5 nm, while changing a thickness t of a first region having a high In composition ratio (+10%) (see table 3). At this time, nanocores in a group of long-wavelength light emitting nanostructures were set to have pitches, diameters and/or heights different from those of nanocores of the short-wavelength light emitting nanostructures, so as to increase the thicknesses of quantum wells grown thereon by four times and increase the In composition ratio by 5% as compared with the corresponding ones of the nanocores of the short-wavelength light emitting nanostructures. Then, a ratio (A (%)/B (%)) of the In composition ratio of the first region to the In composition ratio of the second region was calculated according to changes in t/d values within the quantum wells of the short-wavelength light emitting nanostructures, and the results are shown in table 3.

TABLE 3

| | t (nm) | t/d * 100 (%) | A (%)/B (%) |
|---|---|---|---|
| 1 | 0 | 100 | 25/— |
| 2 | 1.3 | 87 | 27/17 |
| 3 | 1 | 67 | 29/19 |
| 4 | 0.5 | 33 | 31/21 |
| 5 | 0.25 | 17 | 33/23 |
| 6 | 0.1 | 7 | 35/25 |

Figure 15:
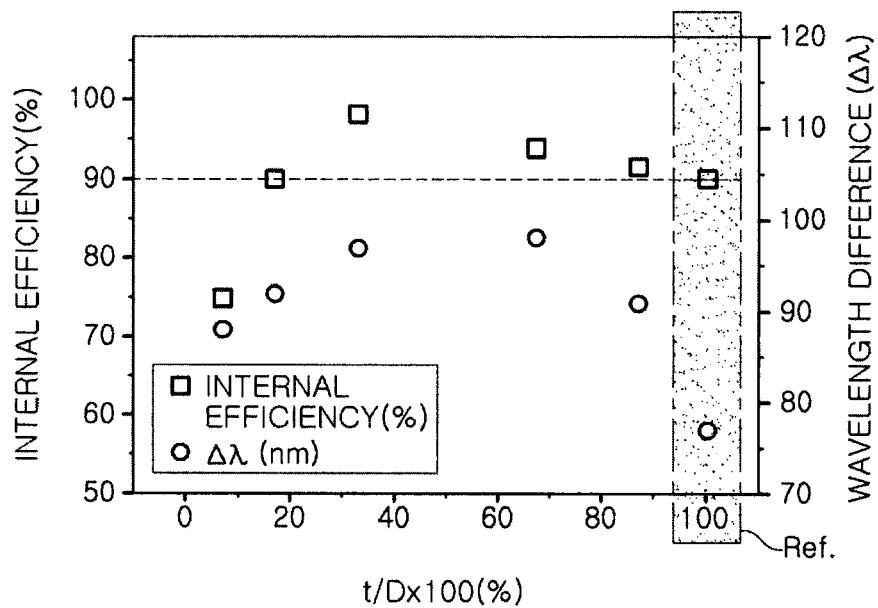
FIG. 15 is a graph illustrating internal quantum efficiency and wavelength difference according to thicknesses of regions having a high In composition ratio, as the results of experiment 3.

When the overall thickness of each quantum well emitting long-wavelength light and the thickness of the first region having a high In composition ratio in the corresponding quantum well were set to be four times the corresponding values of table 3 (the quantum well emitting short-wavelength light) and the In composition ratio in the former was increased by approximately 5% as compared with the corresponding value in the latter, a difference between the wavelengths (nm) of light emitted from the two quantum wells and the sum of internal quantum efficiency (a.u.) of the two quantum wells were calculated and the results are shown in FIG. 15.

As illustrated in FIG. 15, when the ratio (t/d*100) of the thickness of the first region having a high In composition ratio to the overall thickness of the quantum well exceeded 10% and were increased to be 20% or higher, internal quantum efficiency of 90% or higher was achieved. Meanwhile, the wavelength difference was relatively increased as compared with the sample having a uniform In composition ratio (t/d*100=100%), but the effect arising therefrom was insignificant when the t/d ratio was 10%. As a result, it can be verified that in order to improve internal quantum efficiency and secure a sufficient wavelength difference, the ratio (t/d*100) of the thickness of the first region having a high In composition ratio to the overall thickness of the quantum well may be set to be 15% to 90%.

EXPERIMENT 4

Increase in Light Emitting Area

A multi-wavelength light emitting device according to comparative example 3 was manufactured. Specifically, by differently setting pitch values of nanocores in first and second groups of light emitting nanostructures as 1.1 μm and 2.0 μm, respectively, active layers emitting blue light having a wavelength of 440 nm were grown on the nanocores in the first group, while active layers emitting green light having a wavelength of 517 nm were grown on the nanocores in the second group. Here, the active layers in both groups were grown under the same growth conditions, and quantum wells employed therein were set to have a single In composition ratio.

Figure 16:
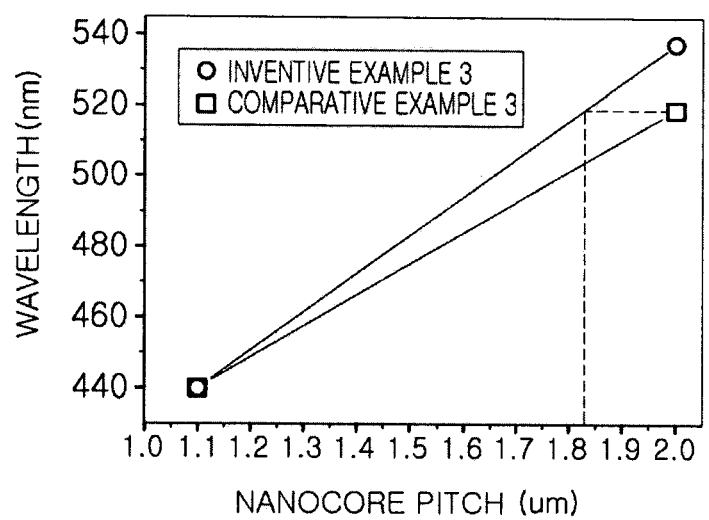
FIG. 16 is a graph illustrating wavelength changes according to pitches of nanocores, as the results of experiment 4.

Under the same conditions as those used in comparative example 3, a multi-wavelength light emitting device according to inventive example 3 was manufactured. In addition, each quantum well of the device according to inventive example 3 was designed to satisfy a 33% t/d ratio (the ratio of the thickness of the first region having a high In composition ratio to the overall thickness of the quantum well) with reference to the results of experiment 3. As a result, relationships between the peak wavelengths and the pitches of the nanocores in respective groups were obtained as illustrated in FIG. 16.

It can be seen that the wavelength of blue light in inventive example 3 was the same as the corresponding one in comparative example 3, while the wavelength of green light in inventive example 3 was increased by approximately 20 nm as compared with the corresponding one in comparative example 3. Such a long-wavelength effect may be represented by an effect of increasing a light emitting area by setting the wavelength conditions to be same. That is, in a case in which the wavelength of green light in inventive example 3 is set to be the same as the corresponding one in comparative example 3, the pitch value may be reduced from 2.0 μm to 1.82 μm. Since the light emitting area is inversely proportional to the square of the pitch value, the light emitting area may be increased by 20.8%.

As described above, by employing a region having a high In composition ratio in a quantum well, a light emitting area of a group of long-wavelength light emitting nanostructures may be increased even under the same wavelength conditions.

Meanwhile, by reducing the thickness of the region having a high In composition ratio in the quantum well emitting long-wavelength light, In composition ratios in a quantum well emitting short-wavelength light may not be represented by a stepped curve. For example, in a case in which the thickness of the region having a high In composition ratio in the quantum well emitting long-wavelength light is set to be equal to or less than 1 nm, since a growth rate of the quantum well emitting short-wavelength light is relatively slow, insufficient supply of source gas in growth sections in which In composition ratios are high may result in problematic growth of the quantum well emitting short-wavelength light. In actuality, non-uniformity of the In composition ratios in the quantum well emitting short-wavelength light may not appear.

As described above, an In composition profile in a quantum well according to example embodiments may be represented by gradients reflecting In change rates, rather than by right-angle steps (see FIG. 4). In addition, the profile may be varied according to changes in process factors affecting In composition ratios such as growth temperature and In source flow rate. FIGS. 17A through 17C and FIGS. 18A and 18B illustrate various examples of an In composition profile in a quantum well.

Figures 17A, 17B:
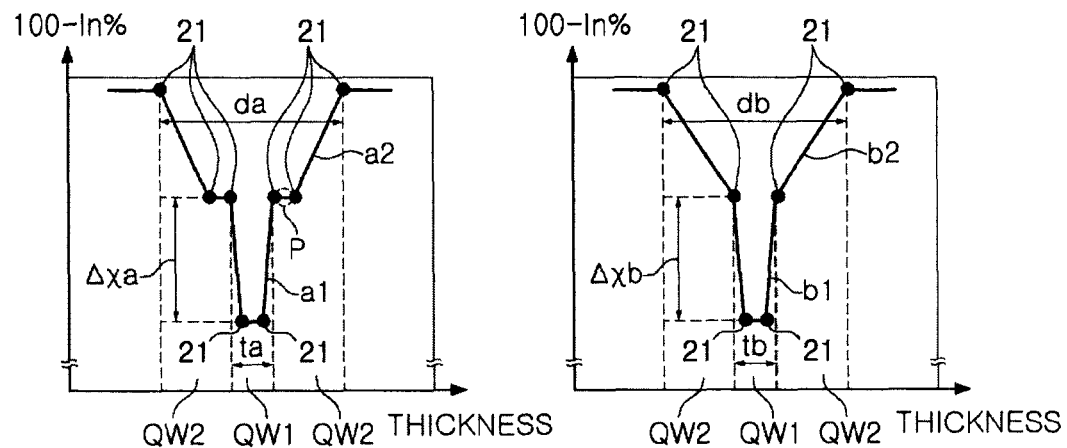
FIGS. 17A through 17C are graphs illustrating various examples of In change rates in a quantum well.
Figure 17C:
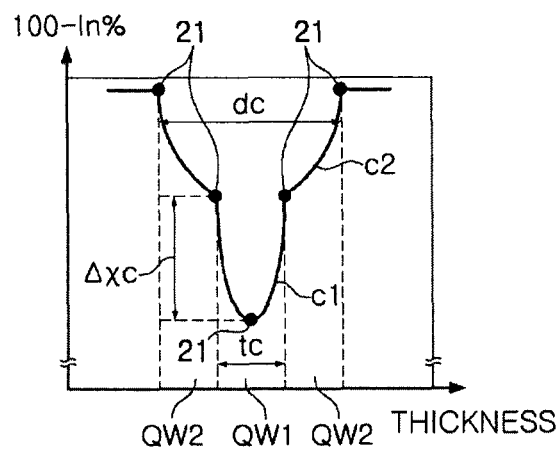

Referring to FIGS. 17A through 17C, a quantum well may include first and second regions QW1 and QW2 having different In composition ratios. A difference between the In composition ratio of the first region QW1 and the In composition ratio of the second region QW2 may be denoted by ΔXa, ΔXb, or ΔXc, and such a composition ratio difference may be defined by a difference between the highest In composition ratio of the first region QW1 and the highest In composition ratio of the second region QW2. The thickness ta, tb, or tc of the first region QW1 may be approximately 15% to 90% of the overall thickness da, db, or dc of the quantum well, but is not limited thereto.

An In composition profile usable in example embodiments may be varied as in the following examples. As illustrated in FIG. 17A, a change rate a1 of the first region QW1 may be higher than a change rate a2 of the second region QW2. For example, when a growth temperature is increased during the growth of the first region QW1, In incorporation may be increased, and thus, the profile of FIG. 17A may be obtained. In FIG. 17A, a relatively flat portion P may appear between the first and second regions QW1 and QW2. Such a flat portion may be understood as a section in which the In incorporation is stably uniformized after the decrease or increase of the growth temperature. According to process conditions, a change rate b1 of the first region QW1 and a change rate b2 of the second region QW2 may differ and a flat portion may not appear as illustrated in FIG. 17B. Meanwhile, a change rate c1 of the first region QW1 and a change rate c2 of the second region QW2 may be represented by a curved line as illustrated in FIG. 17C. The profile of FIG. 17C may be understood as a gradual change in In incorporation rates, or may be represented by a resolution of analysis equipment in some cases.

In the above-described examples, the first region having a high In composition ratio is between the second regions having a low In composition ratio, and the In composition profile is illustrated as being relatively symmetrical. However, a non-symmetrical In composition profile may be obtained in a case in which the first region is more adjacent to one of two quantum barriers, or the like. Examples thereof will be described with reference to FIGS. 18A and 18B.

Similar to the preceding examples, a quantum well may include the first region QW1 having a high In composition ratio and the second region QW2 having a low In composition ratio, as illustrated in FIGS. 18A and 18B. A composition ratio difference ΔXd or ΔXe may be defined by a difference between the highest In composition ratio of the first region QW1 and the highest In composition ratio of the second region QW2.

As illustrated in FIG. 18A, change rates of the first and second regions QW1 and QW2 may differ in an increase section d1 or d2 and a decrease section d1' or d2'. For example, the profile of FIG. 18A may be obtained in a case in which a temperature increase rate is higher than a temperature decrease rate. Meanwhile, as illustrated in FIG. 18B, change rates e1 and e2 of the first and second regions QW1 and QW2 may only differ in a temperature decrease section, while a constant change rate e1' may appear in a temperature increase section. Such a profile may be understood as a case in which the In composition ratio is intentionally increased in the first region QW1. The first region QW1 illustrated in FIG. 18B is adjacent to one of the quantum barriers so as to be non-symmetrical. In these examples, the thickness td or te of the first region QW1 may be approximately 15% to 90% of the overall thickness dd or de of the quantum well, but is not limited thereto.

A nanostructure semiconductor light emitting device according to an example embodiment may be manufactured using various methods. FIGS. 19 through 25 illustrate a process of forming nanocores using a mask as a mold, as an example of the method of manufacturing the nanostructure semiconductor light emitting device.

As illustrated in FIG. 19, a first conductivity-type semiconductor material may be grown on a substrate 31 to form a base layer 32.

The upper surface of the base layer 32 may be divided into first to third regions I, II and III, on which first to third groups of light emitting nanostructures emitting light having different wavelengths may be disposed. In example embodiments, pitches of nanocores may be adjusted at the time of forming the light emitting nanostructures. The first to third regions I, II and III may have different areas and/or different shapes so as to produce white light by considering the number of light emitting nanostructures in each group, luminous efficiency thereof, and the like.

Prior to the growth of the base layer 32, a multilayer structure including a buffer layer containing $Al_xIn_yGa_{1-x-y}N$ ($0 \leq x \leq 1$, $0 \leq y \leq 1$, and $0 \leq x+y \leq 1$) may be further formed on the substrate 31. The multilayer structure may include interlayers including at least one of an undoped GaN layer and an AlGaN layer in order to prevent current leakage in a direction from the base layer 32 to the buffer layer and improve the crystalline quality of the base layer 32.

Figure 20:
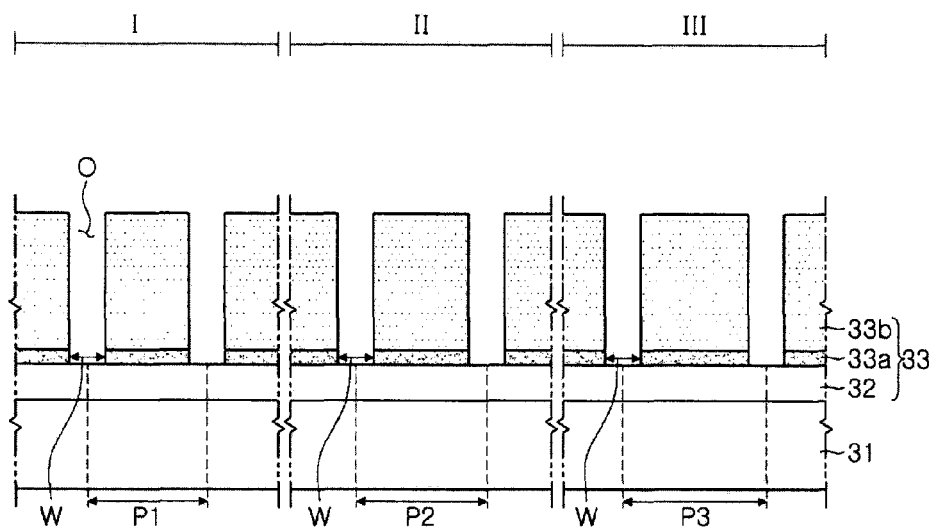

Next, as illustrated in FIG. 20, a mask 33 having a plurality of openings O and including an etch stop layer may be formed on the base layer 32.

The mask 33 used in example embodiments may include a first material layer 33a formed on the base layer 32, and a second material layer 33b formed on the first material layer 33a and having an etching rate higher than that of the first material layer 33a.

The first material layer 33a may be provided as the etch stop layer. That is, the first material layer 33a may have an etch rate lower than that of the second material layer 33b under the same etch conditions. At least the first material layer 33a may be formed of a material having electrical insulating properties, and the second material layer 33b may also be formed of an insulating material as necessary.

The mask 33 may have the plurality of openings O having the same width and having different pitches $P_1<P_2<P_3$ on the first to third regions I, II and III. For example, a pattern of openings on the first region I may be determined by a first pitch $P_1$, and a pattern of openings on the second region II may be determined by a second pitch $P_2$ larger than the first pitch $P_1$. In addition, a pattern of openings on the third region III may be determined by a third pitch $P_3$ larger than the second pitch $P_2$.

In example embodiments, the first and second material layers 33a and 33b may be formed of different materials to obtain a difference in etching rates. For example, the first material layer 33a may be a SiN layer, and the second material layer 33b may be a $SiO_2$ layer. Alternatively, such a difference in the etching rates may be obtained using pore density. By forming the second material layer 33b or the first and second material layers 33a and 33b using a porous material, a difference in porosity may be adjusted to obtain a difference in the etching rates of the first and second material layers 33a and 33b. In example embodiments, the first and second material layers 33a and 33b may be formed of the same material having different porosities. For example, the first material layer 33a may be a $SiO_2$ layer having a first porosity, and the second material layer 33b may be a $SiO_2$ layer having a second porosity higher than the first porosity. Accordingly, the etch rate of the first material layer 33a may be lower than that of the second material layer 33b under conditions under which the second material layer 33b is etched.

An overall thickness of the first and second material layers 33a and 33b may be designed in consideration of a desired height of a nanostructure. An etch stop level set by the first material layer 33a may be determined by considering an overall thickness of the mask 33 from the surface of the base layer 32. After the first and second material layers 33a and 33b are sequentially formed on the base layer 32, the plurality of openings O may be formed in the first and second material layers to expose regions of the base layer 32 therethrough. The openings O may be formed by forming a photoresist on the mask 33 and performing a lithography process and wet/dry etching process. The size of each opening O exposing the surface of the base layer 32 may be designed in consideration of a desired size of the light emitting nanostructure. For example, a width w of the opening O may be 600 nm or less, or may be 50 nm to 500 nm, but is not limited thereto.

The openings O may be formed using a semiconductor process. For example, the openings O may be formed to have a relatively high aspect ratio through a deep-etching process. The aspect ratio of the opening O may be 3:1 or higher, or 10:1 or higher.

In general, a dry etching process is used as the deep-etching process, and reactive ions generated from plasma or ion beams generated in high vacuum may be used. Compared to wet etching, such dry etching allows for precision machining of a micro-structure without geometric constraints. A fluorocarbon or CF-based gas may be used for oxide film etching of the mask 13. For example, an etchant obtained by combining at least one of $O_2$ and Ar with a gas such as $CF_4$, $C_2F_6$, $C_3F_8$, $C_4F_8$, or $CHF_3$ may be used.

Figure 26A:
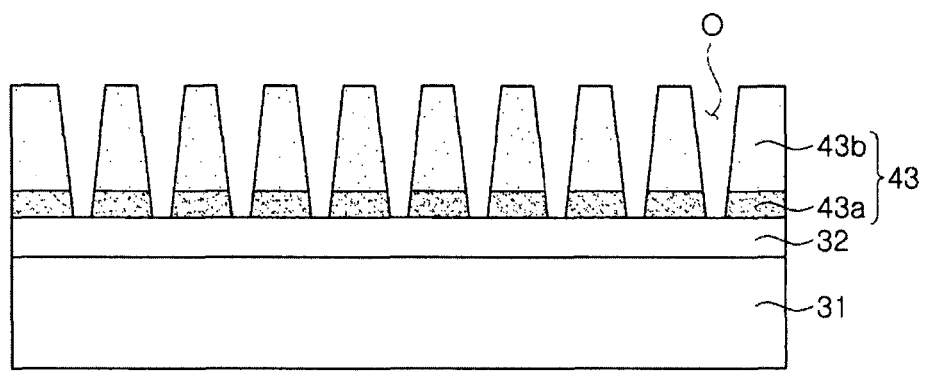
FIGS. 26A and 26B are side cross-sectional views illustrating examples of a mask including openings.
Figure 26B:
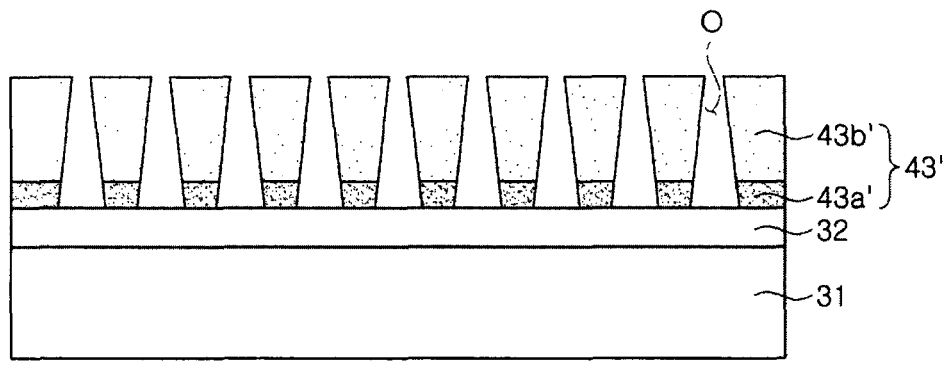

The shape and arrangement of the openings O in a plan view thereof may be variously modified. For example, the opening O may have various shapes such as a circular shape, a hexagonal shape, a polygonal shape, a quadrangular shape, or an elliptical shape. The openings O are illustrated in FIG. 20 as rod structures having the same diameters (widths), but are not limited thereto. The openings O may have various structures formed through an appropriate etching process. For example, masks having openings of different shapes are illustrated in FIGS. 26A and 26B. Referring to FIG. 26A, a mask 43 including first and second material layers 43a and 43b may have openings O, each of which has a rod structure having a cross-sectional area increased toward an upper portion thereof. Referring to FIG. 26B, a mask 43' including first and second material layers 43a' and 43b' may have openings O, each of which has a rod structure having a cross-sectional area reduced toward an upper portion thereof.

Figure 21:
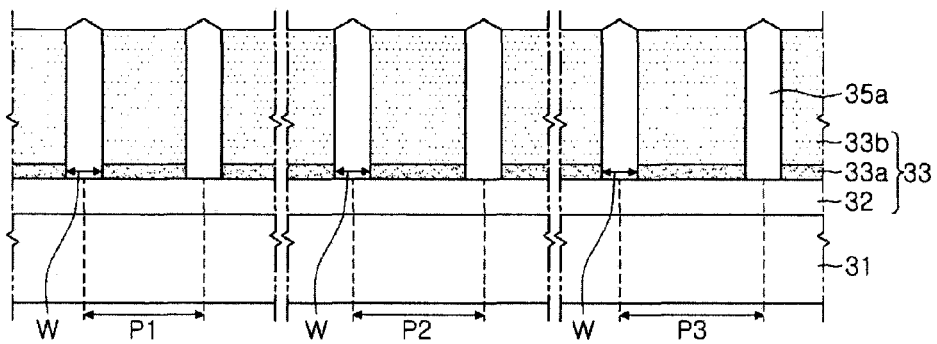

Next, as illustrated in FIG. 21, a first conductivity-type semiconductor material may be grown on the exposed regions of the base layer 32 to fill the plurality of openings O, thereby forming the plurality of nanocores 35a.

The first conductivity-type semiconductor material of the nanocores 35a may be an n-type nitride semiconductor, and may be the same as the first conductivity-type semiconductor material of the base layer 32. For example, the base layer 32 and the nanocores 35a may be formed of n-type GaN.

A nitride single crystal constituting the nanocore 35a may be formed using a metal-organic chemical vapor deposition (MOCVD) process or a molecular beam epitaxy (MBE) process, and the mask 33 may act as a mold for the growth of the nitride single crystal to provide the nanocore 35a corresponding to the shape of the opening O. Namely, the nitride single crystal may be selectively grown on the region of the base layer 32 exposed through the opening O of the mask 13, while filling the opening O, and thus, the shape of the grown nitride single crystal corresponds to that of the opening O. Therefore, although being arranged to have different pitches $P_1<P_2<P_3$ in respective regions, the plurality of nanocores 35a may be formed to have the same size (diameter and height).

Figure 22:
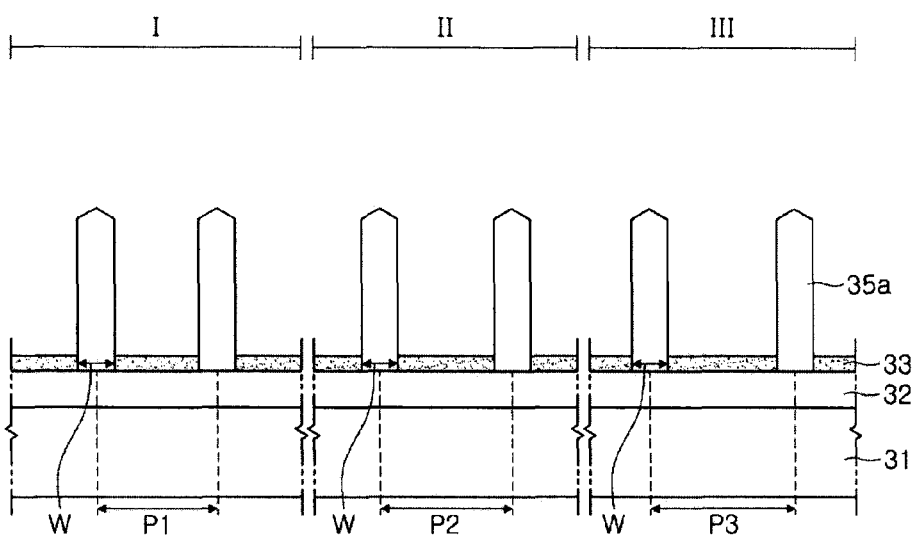

Then, as illustrated in FIG. 22, the mask 33 may be partially removed to the level of the first material layer 33a serving as an etch stop layer to thereby expose a portion of the side surfaces of the plurality of nanocores 35a.

In example embodiments, by using an etching process of selectively removing the second material layer 33b, only the second material layer 33b may be removed, while the first material layer 33a may be retained. The first material layer 33a may serve to reduce or prevent an active layer and a second conductivity-type semiconductor layer from being connected to the base layer 32 in a subsequent growth process.

Figure 23:
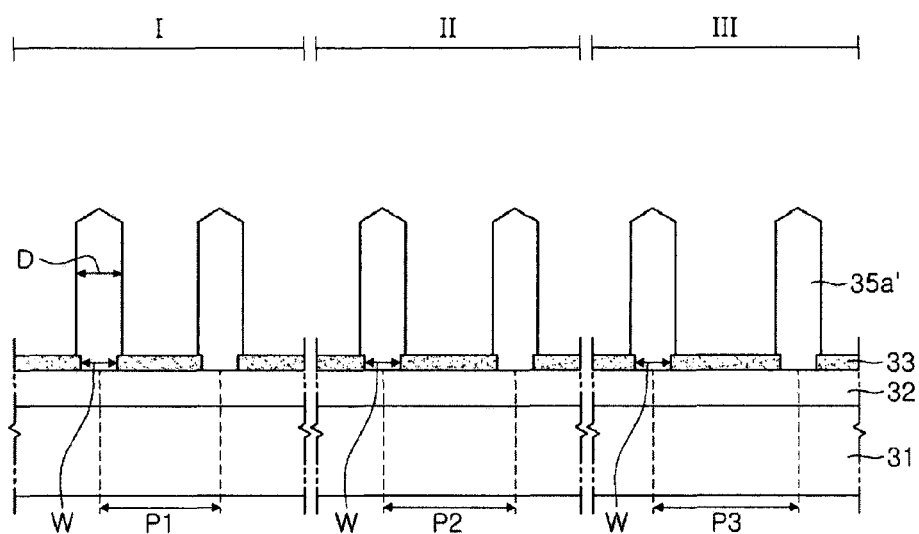

As illustrated in FIG. 23, after the nanocores 35a are completely grown and the second material layer 33b of the mask 33 is removed, the surfaces of the nanocores 35a may be heat-treated or regrown under predetermined and/or desired conditions to change crystal planes of the nanocores 35a into stable planes advantageous for crystal growth, for example semi-polar or non-polar crystal planes. Details thereof will be described with reference to FIGS. 27A and 27B.

Figure 27A:
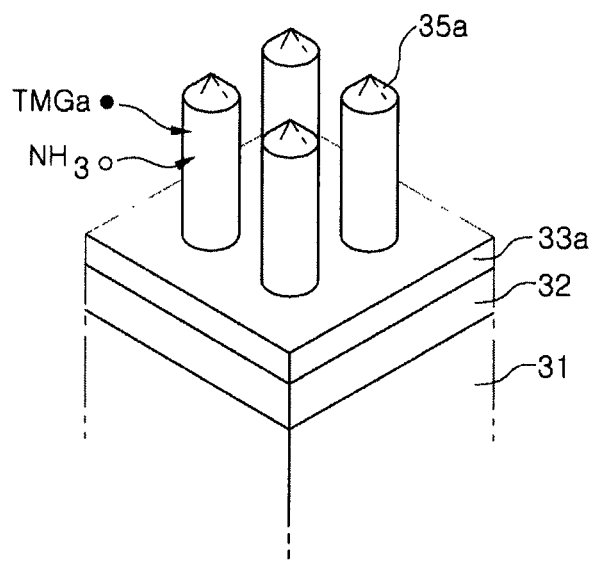
FIGS. 27A and 27B are views illustrating heat treatment or regrowth processes applicable to the processes illustrated in FIGS. 22 and 23.
Figure 27B:
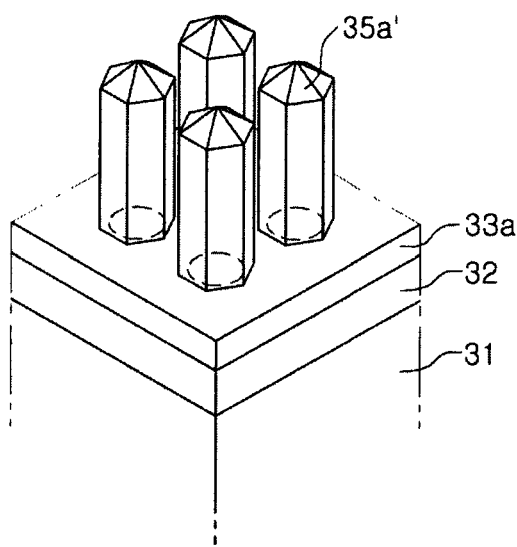

FIGS. 27A and 27B are schematic views illustrating a heat treatment or regrowth applicable to the processes of FIGS. 22 and 23. FIG. 27A illustrates the nanocores 35a obtained in the process of FIG. 22. The nanocores 35a may have crystal planes determined depending on the shape of the openings O. Although differing depending on the shape of the openings, in general, the surfaces of the nanocores 35a thusly obtained may be relatively unstable crystal planes, which may not be advantageous for subsequent crystal growth.

In example embodiments, when the openings have a cylindrical rod shape, the side surfaces of the nanocores 35a may be curved surfaces, rather than particular crystal planes, as illustrated in FIG. 27A.

When such nanocores 35a are heat-treated, unstable crystals on the surfaces thereof may be rearranged to have stable crystal planes such as semi-polar or non-polar planes. As for heat treatment conditions, the nanocores may be heat-treated at a temperature equal to or higher than 600° C., and in a specific example, at a temperature ranging from 800° C. to 1200° C., for a few seconds to tens of minutes (1 second to 60 minutes) to obtain desired stable crystal planes.

In the heat treatment process, if the substrate temperature is lower than 600° C., it may be difficult to grow and rearrange crystals of the nanocores, causing difficulty in obtaining a heat treatment effect, and if the substrate temperature is higher than 1200° C., nitrogen (N) is evaporated from the GaN crystal planes to degrade crystallinity. Also, it may be difficult to obtain a sufficient heat treatment effect for a period of time shorter than 1 second, and a heat treatment performed for tens of minutes, for example, for a period of time longer than 60 minutes, may degrade the manufacturing process efficiency.

The regrowth process may be performed under conditions similar to those for growing the nanocores 35a. For example, n-type GaN may be regrown on the surfaces of the nanocores 35a by resuming the MOCVD process under conditions similar to those for growing n-type GaN for the nanocores 35a after removing the mask.

For example, when the nanocores 35a are grown on a C(0001) plane of a sapphire substrate (a (111) plane in case of a silicon substrate), the nanocores 35a having a cylindrical shape as illustrated in FIG. 27A may be heat-treated or regrown within the aforementioned appropriate temperature range to cause the curved surfaces (side surfaces), which are unstable crystal planes, to change into a hexagonal crystal prism (35a' in FIG. 27B) having stable crystal planes.

Specifically, when the regrowth process is performed, as illustrated in FIG. 27A, source gases such as TMGa and NH$_3$ may be supplied into an MOCVD chamber and the supplied gases may be reacted on the surfaces of the nanocores 35a to form stable crystal planes. Due to this regrowth, widths of the regrown nanocores 35a' may be slightly increased, relative to those of the nanocores 35a prior to the regrowth process (see FIGS. 27A and 27B).

In this manner, crystallinity of the nanocores may be enhanced by using the additional heat treatment and/or regrowth process. Namely, through the additional heat treatment and/or regrowth process, non-uniformities (for example, defects, or the like) present on the surfaces of the nanocores after the removal of the mask may be removed and crystal stability may be enhanced through rearrangement of the internal crystals. In example embodiments, such a heat treatment may be performed in a chamber, under conditions similar to those used in the growth of the nanocores, after removing the mask.

Figure 24:
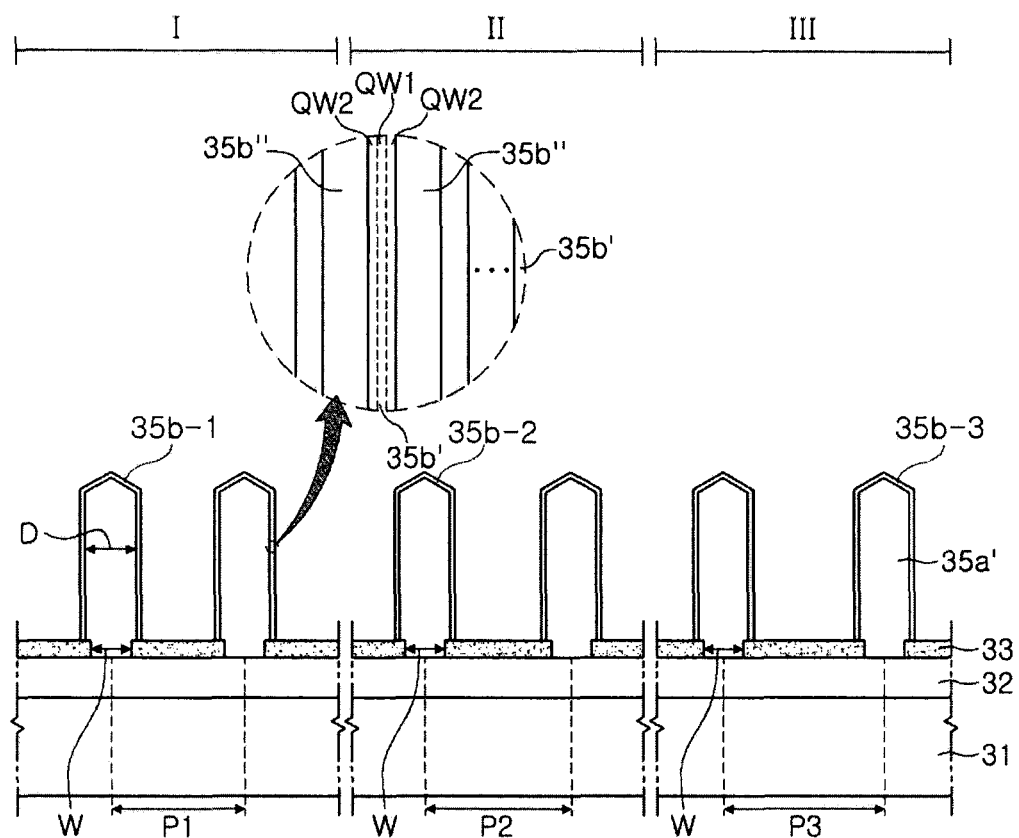

Subsequently, as illustrated in FIG. 24, active layers 35b-1, 35b-2 and 35b-3 may be grown on the surfaces of the plurality of nanocores 35a'.

The present process may be performed on the nanocores 35a' disposed on all of the regions I, II and III under the same conditions. That is, the active layers may be formed by supplying the same source gas at the same flow rate within the same chamber under the same temperature and pressure conditions. Despite the same process conditions, the pitches of the nanocores 35a' differ in the regions I, II and III, and thus, layers grown on the surfaces of the nanocores 35a', for example, the active layers 35b-1, 35b-2 and 35b-3 may have different thicknesses $A_1<A_2<A_3$ in respective regions I, II and III. In addition, since the thicknesses of quantum wells in respective regions differ, the composition thereof (e.g., In composition ratios) may differ. As a result, the active layers 35b-1, 35b-2 and 35b-3 grown in the respective regions I, II and III may emit light having different wavelengths.

For example, the active layers 35b-1 in the first region having the first pitch $P_1$, the smallest pitch, may include a relatively thin quantum well and emit light having a short wavelength such as blue light, while the active layers 35b-3 in the third region having the third pitch $P_3$, the largest pitch, may include a relatively thick quantum well and emit light having a long wavelength such as red light. In addition, the active layers 35b-2 in the second region having the second pitch $P_2$, the middle pitch, may emit light having a wavelength between the aforementioned short and long wavelengths such as green light.

The active layers 35b-1, 35b-2 and 35b-3 used in example embodiments may have a MQW structure in which a plurality of quantum wells 35b' and a plurality of quantum barriers 35b" are alternately stacked. The quantum wells 35b' may be formed of $In_{x1}Ga_{1-x1}N$ ($x_2<x_1<1$), while the quantum barriers 35b" may be formed of $In_{x2}Ga_{1-x2}N$ ($0 \leq x_2 < x_1$). For example, the quantum barriers 35b" may be formed of GaN. Each of the quantum wells 35b' may include a plurality of regions having different In composition ratios in the thickness direction thereof. The quantum well 35b' used in the example embodiments may be divided into a first region QW1 having a relatively high In composition ratio and second regions QW2 having a relatively low In composition ratio, and the first region QW1 may be disposed between the second regions QW2.

Figure 25:
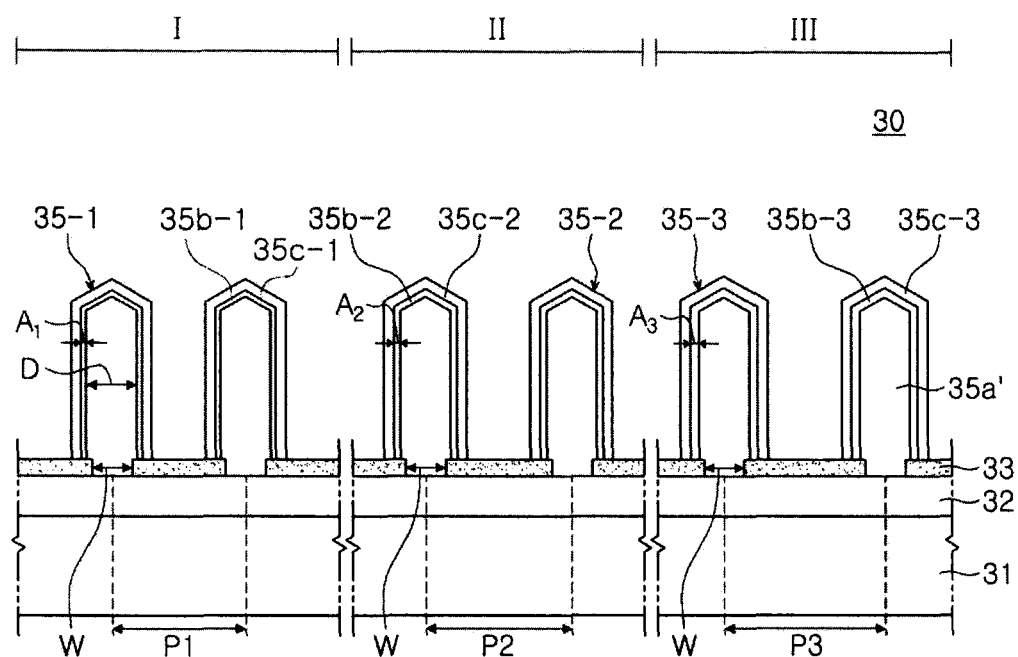

Subsequently, as illustrated in FIG. 25, second conductivity-type semiconductor layers 35c-1, 35c-2 and 35c-3 may be grown on the active layers 35b-1, 35b-2 and 35b-3.

Through this growth process, each light emitting nanostructure 35 may have a core-shell structure including the nanocore formed of the first conductivity-type semiconductor material, and a shell layer formed of the active layer enclosing the nanocore and of the second conductivity-type semiconductor layer enclosing the active layer. The second conductivity-type semiconductor layers 35c-1, 35c-2 and 35c-3 may include a nitride semiconductor containing p-type $Al_xIn_yGa_{1-x-y}N$ ($0 \leq x < 1$, $0 \leq y < 1$, and $0 \leq x+y<1$). Each second conductivity-type semiconductor layer may include a plurality of layers as necessary. The second conductivity-type semiconductor layer may include a p-type AlGaN layer provided as an electron blocking layer (EBL), a p-type GaN layer having low concentration of p-type impurities, and a p-type GaN layer having high concentration of p-type impurities, as illustrated in FIG. 3.

The mask used in the above-described example embodiment includes two material layers by way of example, but is not limited thereto. The mask may include three or more material layers.

For example, in a case of using a mask having first to third material layers sequentially formed on the base layer, the second material layer may serve as an etch stop layer and may be formed of a material different from that of the first and third material layers. The first and third material layers may be formed of the same material, as necessary.

Since an etching rate of the second material layer is lower than an etching rate of the third material layer, the second material layer may serve as an etch stop layer. The first material layer may be formed of a material having electrical insulating properties, and the second or third material layer may also be formed of an insulating material as necessary.

In example embodiments, the formation of a current blocking intermediate layer and the regrowth of nanocores may be performed using the mask illustrated in FIG. 26A, and details thereof will be described with reference to FIG. 28 through FIG. 31.

Figure 28:
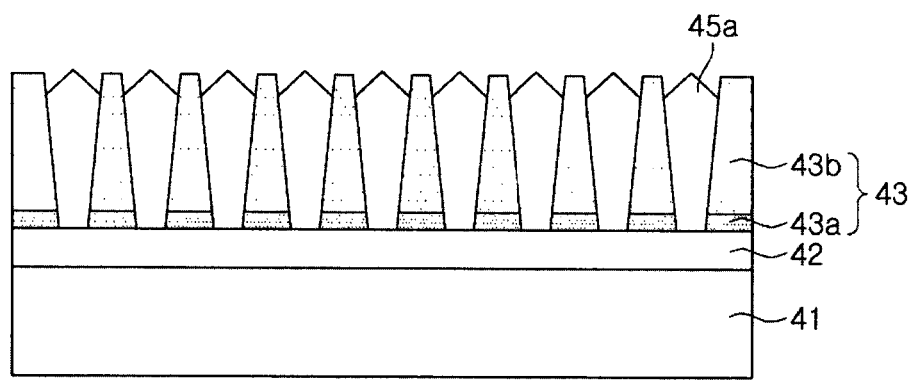
FIGS. 28 through 31 are cross-sectional views illustrating a method of manufacturing a nanostructure semiconductor light emitting device according to another example embodiment in the present disclosure.

As illustrated in FIG. 28, nanocores 45a may be grown on a base layer 42 using a mask 43. The mask may have openings, each of which has a width decreasing toward a lower portion thereof. Each nanocore 45a may be grown to have a shape corresponding to that of the opening.

In order to further enhance crystallinity of the nanocores 45a, a heat treatment process may be performed one or more times during the growth of the nanocores 45a. In particular, surfaces of a tip portion of each nanocore 45a may be rearranged to be hexagonal pyramidal crystal planes, thus obtaining a stable crystal structure and guaranteeing high quality of a crystal grown in a subsequent process.

Figure 29:
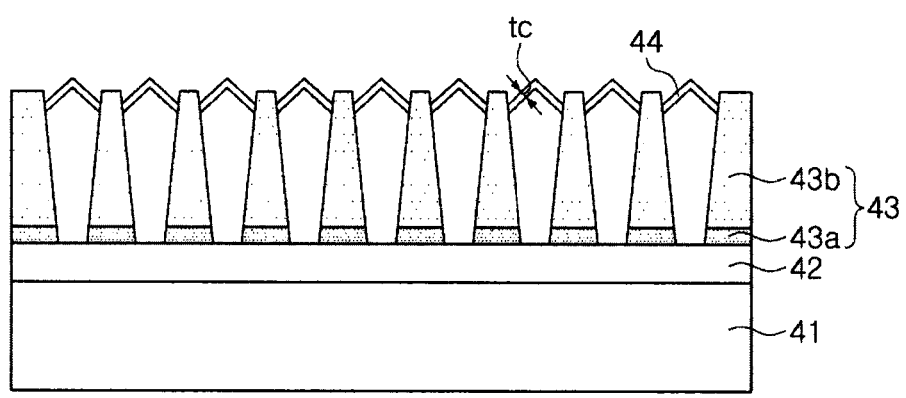

Subsequently, as illustrated in FIG. 29, a current blocking intermediate layer 44 having high resistance properties may be formed on the tip portions of the nanocores 45a.

After the nanocores 45a are formed to have a desired height, the current blocking intermediate layer 44 may be formed on the surfaces of the tip portions of the nanocores 45a with the mask 43 retained. Since the mask 43 is used as is, the current blocking intermediate layer 44 may be easily formed on the desired regions (the surfaces of the tip portions) of the nanocores 45a without forming an additional mask.

The current blocking intermediate layer 44 may be a semiconductor layer intentionally undoped or may be a semiconductor layer doped with a second conductivity-type impurity different from that of the nanocores 45a. For example, in a case in which the nanocores 45a are formed of n-type GaN, the current blocking intermediate layer 44 may be an undoped GaN layer or a GaN layer doped with magnesium (Mg) as a p-type impurity. In example embodiments, by changing types of impurity during the same growth process, the nanocores 45a and the current blocking intermediate layer 44 may be consecutively formed. For example, in case of stopping silicon (Si) doping, and then injecting magnesium (Mg) and growing the same for approximately 1 minute under the same conditions as those of the growth of the n-type GaN nanocores, the current blocking intermediate layer 44 may be formed to have a thickness ranging from approximately 200 nm to 300 nm, and such a current blocking intermediate layer 44 may effectively block a leakage current of a few μA or higher. In this manner, the current blocking intermediate layer may be simply formed during the mold-type process in example embodiments.

Figure 30:
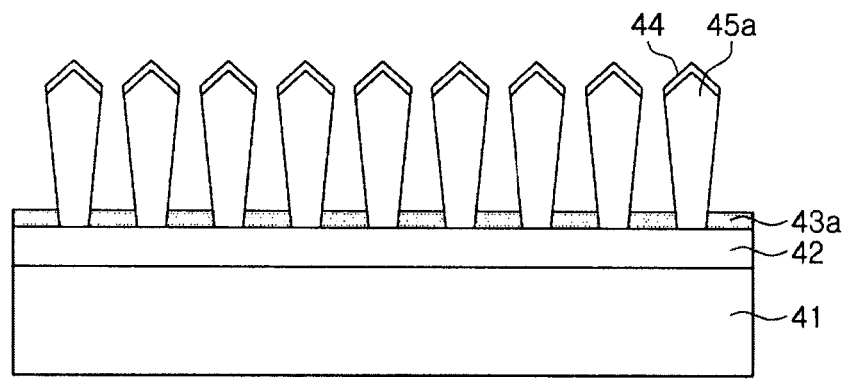

Subsequently, as illustrated in FIG. 30, the mask 43 may be partially removed to the level of a first material layer 43a serving as an etch stop layer to thereby expose a portion of the side surfaces of the plurality of nanocores 45a.

In example embodiments, by using an etching process of selectively removing a second material layer 43b, only the second material layer 43b may be removed, while the first material layer 43a may be retained. The residual first material layer 43a may serve to prevent an active layer and a second conductivity-type semiconductor layer from being connected to the base layer 42 in a subsequent growth process.

In example embodiments, an additional heat treatment process may be used during the process of forming the light emitting nanostructures using the mask having the openings as the mold in order to enhance crystallinity.

Figure 31:
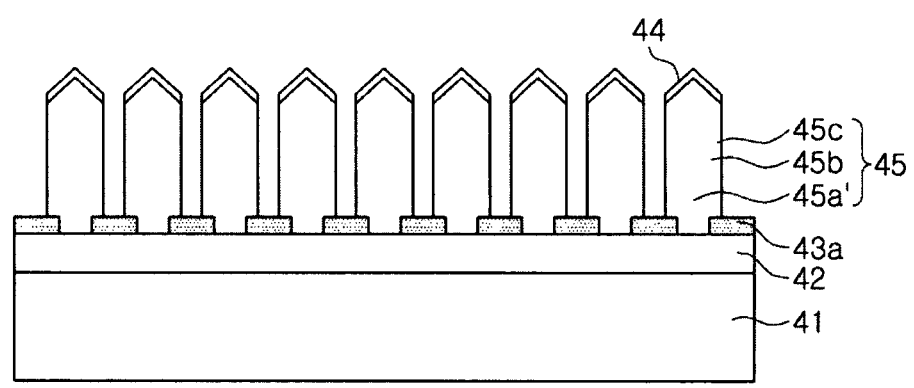

After the second material layer 43b of the mask 43 is removed, a heat treatment or regrowth process may be performed on the surfaces of the nanocores 45a to change unstable crystal planes of the nanocores 45a into stable crystal planes (e.g., refer to FIGS. 27A and 27B for further detail). In particular, in example embodiments, the nanocores 45a may be grown on the openings having inclined side walls, such that they have inclined side walls corresponding to the shapes of the openings. However, as illustrated in FIG. 31, after the heat treatment or regrowth process, crystals may be rearranged and regrown, so that nanocores 45a' have a substantially uniform diameter (or width). Also, the tip portions of the nanocores 45a immediately after being grown may have an incomplete hexagonal pyramidal shape, while those of the nanocores 45a' after the regrowth process may have a hexagonal pyramidal shape having uniform facets. After the removal of the mask, the nanocores 45a having a non-uniform width may be regrown (and/or rearranged) to form the nanocores 45a' having a hexagonal prism structure having a uniform width and stable crystal planes through the heat treatment.

Figure 32:
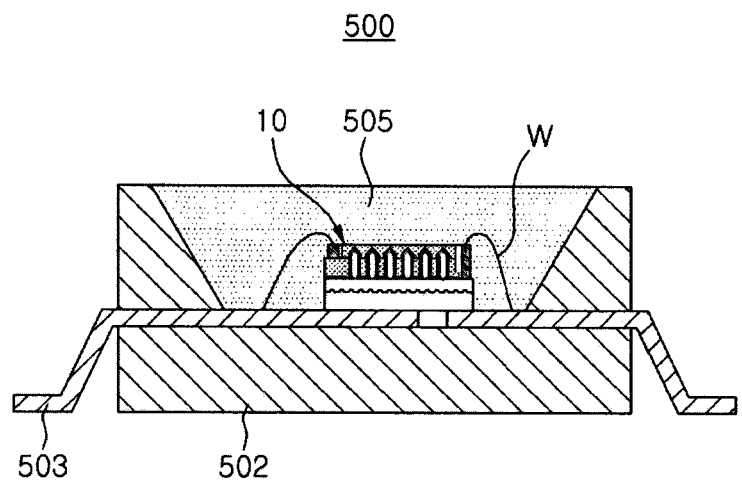
FIG. 32 is a cross-sectional view of a semiconductor light emitting device package including a nanostructure semiconductor light emitting device according to an example embodiment in the present disclosure.

The nanostructure semiconductor light emitting devices according to the above-described example embodiments may be usefully applied to various products. FIG. 32 illustrates an example of a semiconductor light emitting device package including a nanostructure semiconductor light emitting device according to an example embodiment.

As set forth above, in example embodiments, one or more components of the light emitting structures in one or more regions may have different shapes; for example, different sizes, different diameters, different heights, different thicknesses, different aspect ratios, different pitches, and/or different concentrations, of, for example, Indium (In).

A semiconductor light emitting device package 500 illustrated in FIG. 32 may include the nanostructure semiconductor light emitting device 10 of FIG. 1, a package body 502, and a pair of lead frames 503.

The nanostructure semiconductor light emitting device 10 may be mounted on the pair of lead frames 503 and electrodes thereof may be electrically connected to the pair of lead frames 503. As necessary, the nanostructure semiconductor light emitting device 10 may be mounted on a different region, for example, on the package body 502, rather than on the pair of lead frames 503. Also, the package body 502 may have a cup shape to improve reflectivity efficiency of light. An encapsulant 505 formed of a light-transmissive material may be formed in such a reflective cup to encapsulate the nanostructure semiconductor light emitting device 10, wires, and the like.

The nanostructure semiconductor light emitting devices according to the above-described example embodiments may be used as light sources for various products. FIGS. 33 through 36 illustrate examples of various products including nanostructure semiconductor light emitting devices according to example embodiments.

Figure 33:
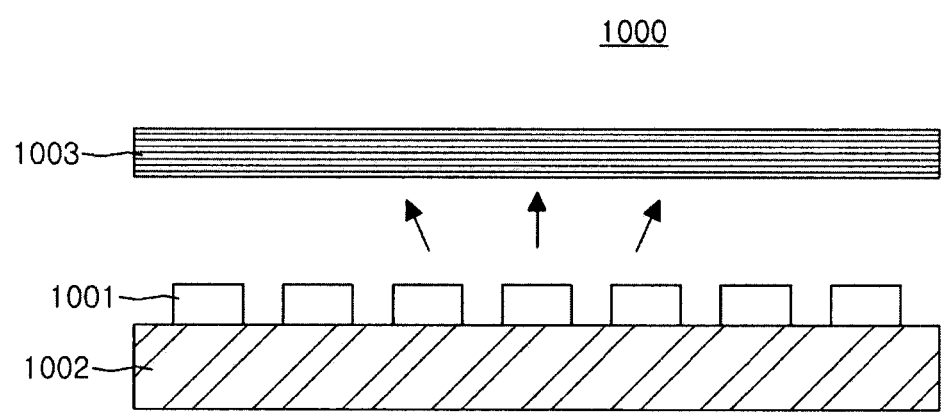
FIGS. 33 and 34 illustrate examples of a backlight unit including a nanostructure semiconductor light emitting device according to an example embodiment in the present disclosure.
Figure 34:
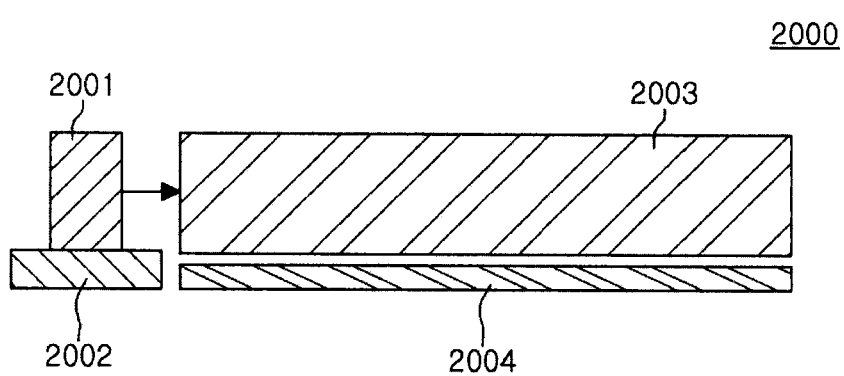

FIGS. 33 and 34 illustrate examples of a backlight unit including a nanostructure semiconductor light emitting device according to an example embodiment.

Referring to FIG. 33, a backlight unit 1000 may include at least one light source 1001 mounted on a substrate 1002 and at least one optical sheet 1003 disposed above the light source 1001. The aforementioned nanostructure semiconductor light emitting device or the aforementioned package having the nanostructure semiconductor light emitting device may be used as the light source 1001.

The light source 1001 in the backlight unit 1000 of FIG. 33 emits light toward a liquid crystal display (LCD) device disposed thereabove, whereas a light source 2001 mounted on a substrate 2002 in a backlight unit 2000 as another example illustrated in FIG. 34 emits light laterally, and the light is incident to a light guide plate 2003 such that the backlight unit 2000 may serve as a surface light source. The light travelling to the light guide plate 2003 may be emitted upwardly and a reflective layer 2004 may be disposed below a lower surface of the light guide plate 2003 in order to improve light extraction efficiency.

Figure 35:
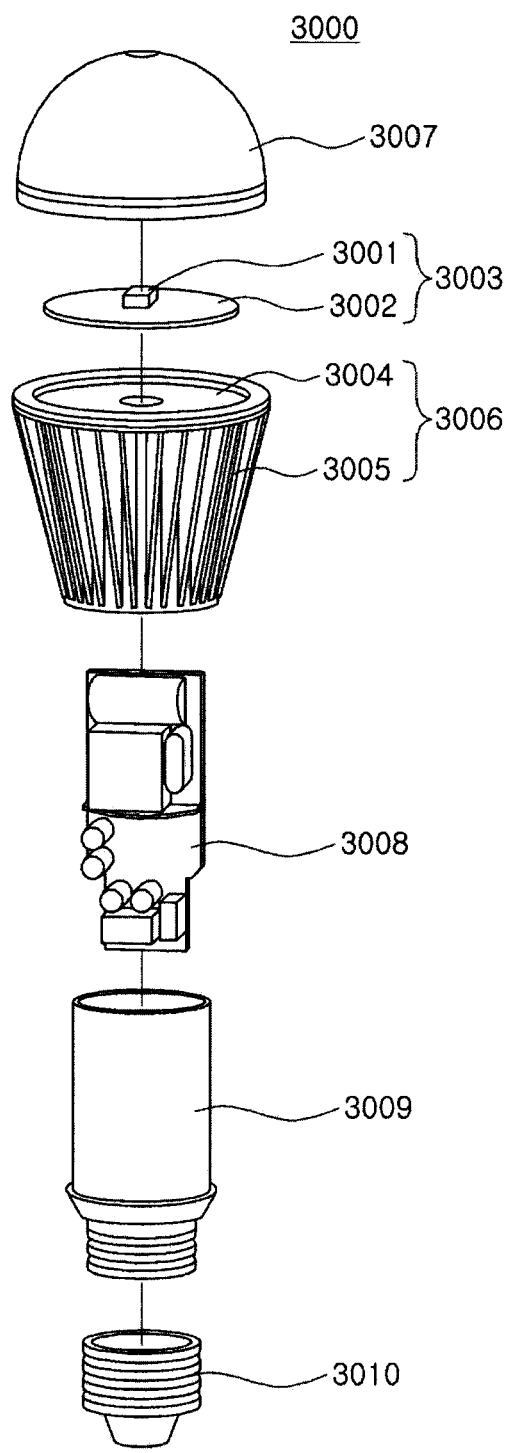
FIG. 35 illustrates an example of a lighting device including a nanostructure semiconductor light emitting device according to an example embodiment in the present disclosure.

FIG. 35 is an exploded perspective view illustrating an example of a lighting device including a nanostructure semiconductor light emitting device according to an example embodiment.

A lighting device 3000 is illustrated as a bulb-type lamp in FIG. 35, and includes a light emitting module 3003, a driver 3008, and an external connector 3010.

In addition, the lighting device 3000 may further include exterior structures such as external and internal housings 3006 and 3009, a cover 3007, and the like. The light emitting module 3003 may include a light source 3001 that may be the aforementioned nanostructure semiconductor light emitting device or the aforementioned package having the same, and a circuit board 3002 on which the light source 3001 is mounted. For example, first and second electrodes of the nanostructure semiconductor light emitting device may be electrically connected to an electrode pattern of the circuit board 3002. In example embodiments, a single light source 3001 is mounted on the circuit board 3002 by way of example; however, a plurality of light sources may be mounted thereon as necessary.

The external housing 3006 may serve as a heat radiator and may include a heat sink plate 3004 directly contacting the light emitting module 3003 to thereby improve heat dissipation and heat radiating fins 3005 surrounding a lateral surface of the lighting device 3000. The cover 3007 may be disposed above the light emitting module 3003 and have a convex lens shape. The driver 3008 may be disposed inside the internal housing 3009 and be connected to the external connector 3010 such as a socket structure to receive power from an external power source.

In addition, the driver 3008 may convert the received power into power appropriate for driving the light source 3001 of the light emitting module 3003 and supply the converted power thereto. For example, the driver 3008 may be configured as an AC-DC converter, a rectifying circuit part, or the like.

Figure 36:
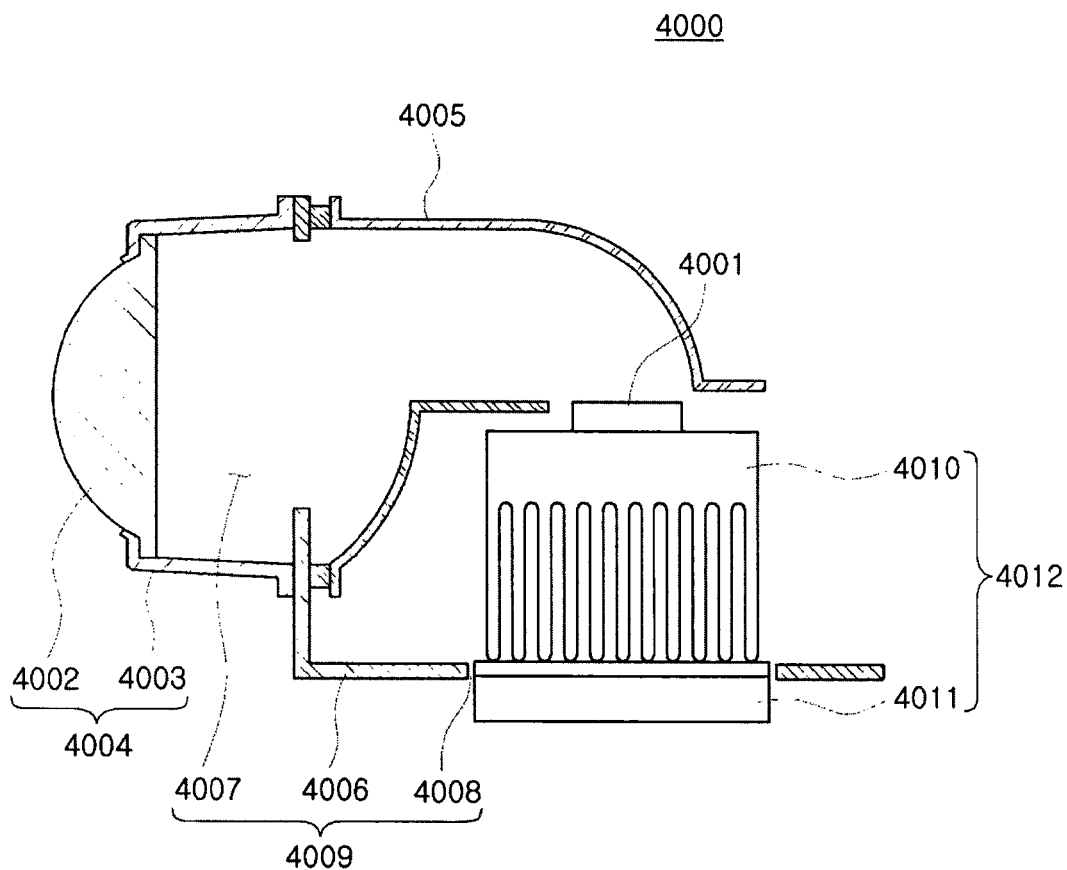
FIG. 36 illustrates an example of a headlamp including a nanostructure semiconductor light emitting device according to an example embodiment in the present disclosure.

FIG. 36 illustrates an example of a headlamp including a nanostructure semiconductor light emitting device according to an example embodiment.

With reference to FIG. 36, a headlamp 4000 used in a vehicle or the like may include a light source 4001, a reflector 4005 and a lens cover 4004, and the lens cover 4004 may include a hollow guide part 4003 and a lens 4002. The light source 4001 may include the aforementioned nanostructure semiconductor light emitting device or the aforementioned package having the same.

The headlamp 4000 may further include a heat radiator 4012 dissipating heat generated by the light source 4001 outwardly. The heat radiator 4012 may include a heat sink 4010 and a cooling fan 4011 in order to effectively dissipate heat. In addition, the headlamp 4000 may further include a housing 4009 allowing the heat radiator 4012 and the reflector 4005 to be fixed thereto and supporting them. The housing 4009 may include a body 4006 and a central hole 4008 formed in one surface thereof, to which the heat radiator 4012 is coupled.

The housing 4009 may include a forwardly open hole 4007 formed in the other surface thereof integrally connected to one surface thereof and bent in a direction perpendicular thereto. The reflector 4005 may be fixed to the housing 4009, such that light generated by the light source 4001 may be reflected by the reflector 4005, pass through the forwardly open hole 4007, and be emitted outwardly.

Additionally, each of the features described above may be combined in any appropriate manner to obtain nanostructure semiconductor light emitting devices, light emitting nanostructures, methods, and/or apparatuses with various combinations of features. In this regard, U.S. application Ser. No. 14/551,978, filed Nov. 24, 2014; Ser. No. 14/723,869, filed May 28, 2015; Ser. No. 13/599,430, filed Aug. 30, 2012; Ser. No. 14/501,232, filed Sep. 30, 2014; and U.S. application Ser. No. 14/828,004, filed Aug. 17, 2015; are each hereby incorporated by reference in their entirety, thereby disclosing additional nanostructure semiconductor light emitting devices, light emitting nanostructures, methods, and/or apparatuses with various additional combinations of features.

While example embodiments have been shown and described above, it will be apparent to those skilled in the art that modifications and variations could be made without departing from the scope of the present disclosure as defined by the appended claims.

The invention claimed is:

1. A method of manufacturing a semiconductor light emitting device comprising:
   forming a substructure including at least one light emitting region and at least one electrode region; and
   forming a plurality of light emitting nanostructures of different wavelengths in a common pattern in the at least one light emitting region by varying an indium (In) composition ratio in an active layer of each of the plurality of light emitting nanostructures.

2. The method of claim 1, wherein the indium (In) composition ratio is varied by varying a growth temperature of the plurality of light emitting nanostructures.

3. The method of claim 1, wherein the indium (In) composition ratio is varied by varying an indium (In) source flow rate.

4. The method of claim 1, wherein forming the plurality of light emitting nanostructures in the common pattern in the at least one light emitting region includes forming the plurality of light emitting nanostructures in at least three light emitting regions, each having a different pitch.

5. The method of claim 4, wherein the plurality of light emitting nanostructures with greater pitches are formed with at least one of a greater growth thickness, a greater Indium (In) content and a greater wavelength.

6. The method of claim 1, wherein the substructure is formed by:
   providing a substrate,
   forming a base layer on the substrate, and
   forming a mask layer on the base layer.

7. The method of claim 6, wherein the plurality of light emitting nanostructures are formed by:
   forming a mold layer on the mask layer;
   forming openings in the mold layer;
   forming a plurality of first conductivity-type semiconductor cores in the openings in the mold layer;
   forming an active layer on each of the plurality of first conductivity-type semiconductor cores; and forming a second conductivity-type semiconductor shell on each of the active layers to form the plurality of light emitting nanostructures.

8. The method of claim 7, wherein forming the plurality of first conductivity-type semiconductor cores in the openings in the mold layer includes performing a re-growth process.

9. The method of claim 7, further comprising:
removing the mold layer and leaving the mask layer by selective etching to prevent the active layer and the second conductivity-type semiconductor shell from contacting the base layer.

10. The method of claim 9, further comprising:
forming a first conductivity-type electrode of a first conductivity-type in a first electrode region and forming a second conductivity-type electrode of a second conductivity-type in a second electrode region.

11. The method of claim 7, wherein forming each three-dimensional (3-D) nanostructure further includes forming a current blocking intermediate layer on a portion of each of the plurality of first conductivity-type semiconductor cores.

12. The method of claim 1, wherein the common pattern is a hexagonal pattern of differing pitches.

13. The method of claim 1, wherein forming the plurality of light emitting nanostructures of different wavelengths includes forming the active layer of each of the plurality of light emitting nanostructures as a single quantum well.

14. The method of claim 13, wherein the indium (In) composition ratio is varied in a radial direction of each single quantum well of each of the plurality of light emitting nanostructures.

15. The method of claim 14, wherein the indium (In) composition ratio is greater at a center of the single quantum well of each of the plurality of light emitting nanostructures in the radial direction and lower at boundaries of the single quantum well in a radial direction of the plurality of light emitting nanostructures.

16. The method of claim 1, wherein forming the plurality of light emitting nanostructures of different wavelengths includes forming the active layer of each of the plurality of light emitting nanostructures as a multi-quantum well structure.

17. The method of claim 16, wherein the indium (In) composition ratio is varied in a radial direction of each of the multi-quantum well structures of each of the plurality of light emitting nanostructures.

18. The method of claim 17, wherein the indium (In) composition ratio is greater in central ones of a plurality of quantum wells of each multi-quantum well structure in the radial direction and lower in peripheral ones of the plurality of quantum wells of each multi-quantum well structure.

19. The method of claim 17, wherein the indium (In) composition ratio is greater at a center of each of a plurality of quantum wells of each multi-quantum well structure in the radial direction and lower at boundaries of each of the plurality of quantum wells of each multi-quantum well structure.

20. The method of claim 17, wherein the indium (In) composition ratio is greater in central ones of a plurality of quantum wells of each multi-quantum well structure in the radial direction and lower in peripheral ones of the plurality of quantum wells of each multi-quantum well structure and the indium (In) composition ratio is greater at a center of each of the plurality of quantum wells of each multi-quantum well structure in the radial direction and lower at boundaries of the plurality of quantum wells of each multi-quantum well structure.

* * * * *